*(12)* United States Patent
Lee et al.

US012432906B2

*(10)* Patent No.: US 12,432,906 B2
*(45)* Date of Patent: Sep. 30, 2025

*(54)* MEMORY DEVICE INCLUDING DUMMY CAPACITOR SHIELDING STRUCTURE AND MANUFACTURING METHOD THEREOF

*(71)* Applicant: SAMSUNG ELECTRONICS CO., LTD., Suwon-si (KR)

*(72)* Inventors: Seonhaeng Lee, Suwon-si (KR); Iloh Jang, Yongin-si (KR); Jisook Hong, Suwon-si (KR)

*(73)* Assignee: SAMSUNG ELECTRONICS CO., LTD., Suwon-si (KR)

*( * )* Notice: Subject to any disclaimer, the term of this patent is extended or adjusted under 35 U.S.C. 154(b) by 453 days.

*(21)* Appl. No.: 17/882,215

*(22)* Filed: Aug. 5, 2022

*(65)* Prior Publication Data

US 2023/0164978 A1    May 25, 2023

*(30)* Foreign Application Priority Data

Nov. 25, 2021    (KR) .................. 10-2021-0164383
Mar. 7, 2022    (KR) .................. 10-2022-0028804

*(51)* Int. Cl.
*H10B 12/00*    (2023.01)
*(52)* U.S. Cl.
CPC .......... *H10B 12/315* (2023.02); *H10B 12/03* (2023.02); *H10B 12/485* (2023.02)
*(58)* Field of Classification Search
CPC ...... H10B 12/03; H10B 12/50; H10B 12/033; H10B 12/09; H10B 12/315; H10B 12/485; H01L 23/5225; H01L 23/552
See application file for complete search history.

*(56)* References Cited

U.S. PATENT DOCUMENTS

| | | | |
|---|---|---|---|
| 4,961,166 A | 10/1990 | Sato et al. | |
| 6,751,142 B2 | 6/2004 | Hanzawa et al. | |
| 9,478,520 B2 | 10/2016 | Tsukimura et al. | |
| 2003/0219942 A1 | 11/2003 | Choi et al. | |
| 2010/0102371 A1* | 4/2010 | Yeom ................ | H01L 21/76224 257/296 |

(Continued)

FOREIGN PATENT DOCUMENTS

| | | |
|---|---|---|
| JP | 4373464 B2 | 11/2009 |
| JP | 2020-92153 A | 6/2020 |

(Continued)

*Primary Examiner* — Davienne N Monbleau
*Assistant Examiner* — Emily Farmer
*(74) Attorney, Agent, or Firm* — Sughrue Mion, PLLC

*(57)* ABSTRACT

The present disclosure refers to memory devices and manufacturing methods thereof. In an embodiment, a memory device includes a memory cell array, a first dummy capacitor, a second dummy capacitor, and a third dummy capacitor. The memory cell array includes gate structures formed on a substrate, first active regions adjacent to the gate structures, gate insulating layers disposed between the gate structures and the first active regions, and cell capacitors connected to the first active regions. The first and second dummy capacitors extend in a first direction and in the vertical direction, and are disposed to be adjacent to the memory cell array in a second direction. The third dummy capacitor extends in the second direction and the vertical direction and is disposed to be adjacent to the memory cell array in the first direction. The memory cell array is disposed between the first and second dummy capacitors.

12 Claims, 28 Drawing Sheets

(56) References Cited

U.S. PATENT DOCUMENTS

2016/0211267 A1 7/2016 Atsumi et al.
2021/0066303 A1* 3/2021 Huang ................. H10B 12/315

FOREIGN PATENT DOCUMENTS

| JP | 2020092153 | * | 6/2020 |
| KR | 2000-0054949 A | | 9/2000 |
| KR | 2003-0091226 A | | 12/2003 |
| KR | 20210046480 | * | 4/2021 |

* cited by examiner

MEMORY DEVICE INCLUDING DUMMY CAPACITOR SHIELDING STRUCTURE AND MANUFACTURING METHOD THEREOF

CROSS-REFERENCE TO RELATED APPLICATIONS

This application claims benefit of priority to Korean Patent Application Nos. 10-2021-0164383, filed on Nov. 25, 2021, and 10-2022-0028804 filed on Mar. 7, 2022, in the Korean Intellectual Property Office, the disclosures of which are incorporated herein by reference in their entireties.

BACKGROUND

1. Technical Field

The disclosure relates to a memory device and a manufacturing method thereof.

2. Description of Related Art

Memory devices released from a production line may be delivered to users through various means of transportation. When memory devices are exported abroad, transportation means such as ships or aircraft may be used. Aircraft is costly but supports fast transportation. However, in the case of transporting memory devices by aircraft, the memory devices may be affected by radiation depending on a route and altitude of the aircraft, and product defects may occur due to the radiation.

SUMMARY

An aspect of the disclosure provides for a memory device including a structure capable of suppressing an occurrence of defects in memory elements by shielding the memory elements that may otherwise become defective due to the influence of radiation.

Another aspect of the disclosure provides for a method of manufacturing a memory device, capable of forming a structure for shielding memory elements without a separate additional process.

According to an aspect of the disclosure, a memory device includes a memory cell array, a first dummy capacitor, a second dummy capacitor, and a third dummy capacitor. The memory cell array includes gate structures formed on a substrate, first active regions adjacent to the gate structures, gate insulating layers disposed between the gate structures and the first active regions, and cell capacitors connected to the first active regions and extending in a vertical direction with respect to a surface of the substrate. The first dummy capacitor and the second dummy capacitor extend in a first direction and in the vertical direction, and are disposed to be adjacent to the memory cell array in a second direction intersecting the first direction. The first direction and the second direction are parallel to the surface of the substrate. The third dummy capacitor extends in the second direction and the vertical direction and is disposed to be adjacent to the memory cell array in the first direction. The memory cell array is disposed between the first dummy capacitor and the second dummy capacitor.

According to another aspect of the disclosure, a memory device includes a substrate, a plurality of cell capacitors, a plurality of first dummy capacitors, and a plurality of second dummy capacitors. The substrate includes a first region having word lines and bit lines and a second region. The second region surrounds the first region. The plurality of cell capacitors extend from the first region in a vertical direction with respect to a surface of the substrate. Each cell capacitor of the plurality of cell capacitors is connected to one of the word lines and one of the bit lines. The plurality of first dummy capacitors extends from the second region in the vertical direction and in a first direction in which the word lines extend. The plurality of first dummy capacitors are adjacent to the first region in a second direction parallel to the surface of the substrate. The plurality of second dummy capacitors extend from the second region in the vertical direction and in the second direction in which the bit lines extend. The plurality of second dummy capacitors are adjacent to the first region in the first direction.

According to another aspect of the disclosure, a method of manufacturing a memory device includes forming a device separation layer in a first region of a substrate including the first region and a second region surrounding the first region. The method further includes forming a plurality of gate structures on the substrate in the first region. The method further includes forming first contacts connected to the substrate between a pair of gate structures adjacent to each other among the plurality of gate structures. The method further includes forming, when the first contacts are formed, bit line structures connected to the first contacts, in the first region. The method further includes forming second contacts connected to the substrate in the first region. The method further includes forming third contacts connected to the substrate in the second region. The method further includes forming a plurality of cell capacitors connected to the second contacts in the first region. The method further includes forming a plurality of dummy capacitors connected to the third contacts in the second region, wherein the plurality of cell capacitors and the plurality of dummy capacitors are simultaneously formed, and wherein the second contacts and the third contacts are simultaneously formed.

BRIEF DESCRIPTION OF DRAWINGS

The above and other aspects, features, and advantages of the disclosure will be more clearly understood from the following detailed description, taken in conjunction with the accompanying drawings, in which.

DETAILED DESCRIPTION

The embodiments described herein are example embodiments, and thus, the disclosure is not limited thereto and may be realized in various other forms.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, example embodiments of the disclosure will be described with reference to the accompanying drawings.

Figure 1:
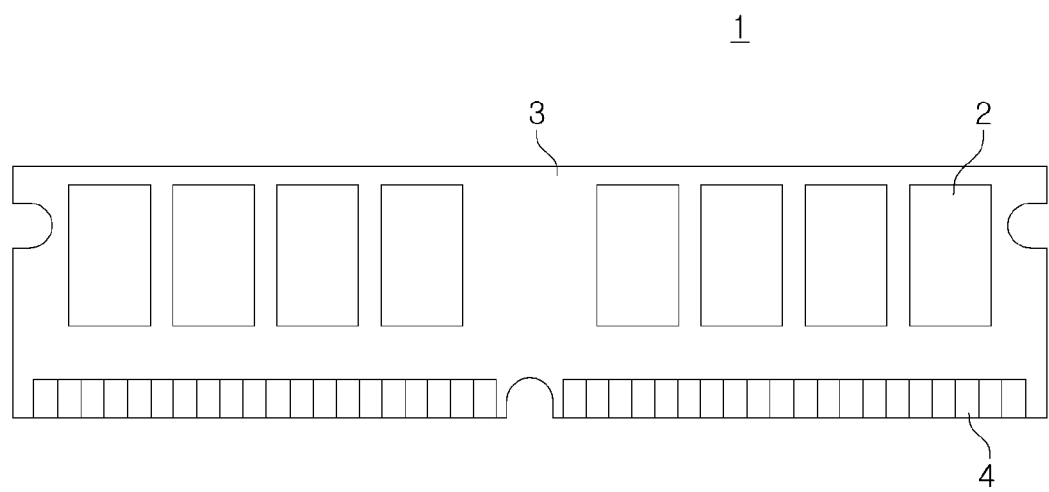
FIGS. 1 and 2 are diagrams illustrating a memory device according to an example embodiment of the disclosure.
Figure 2:
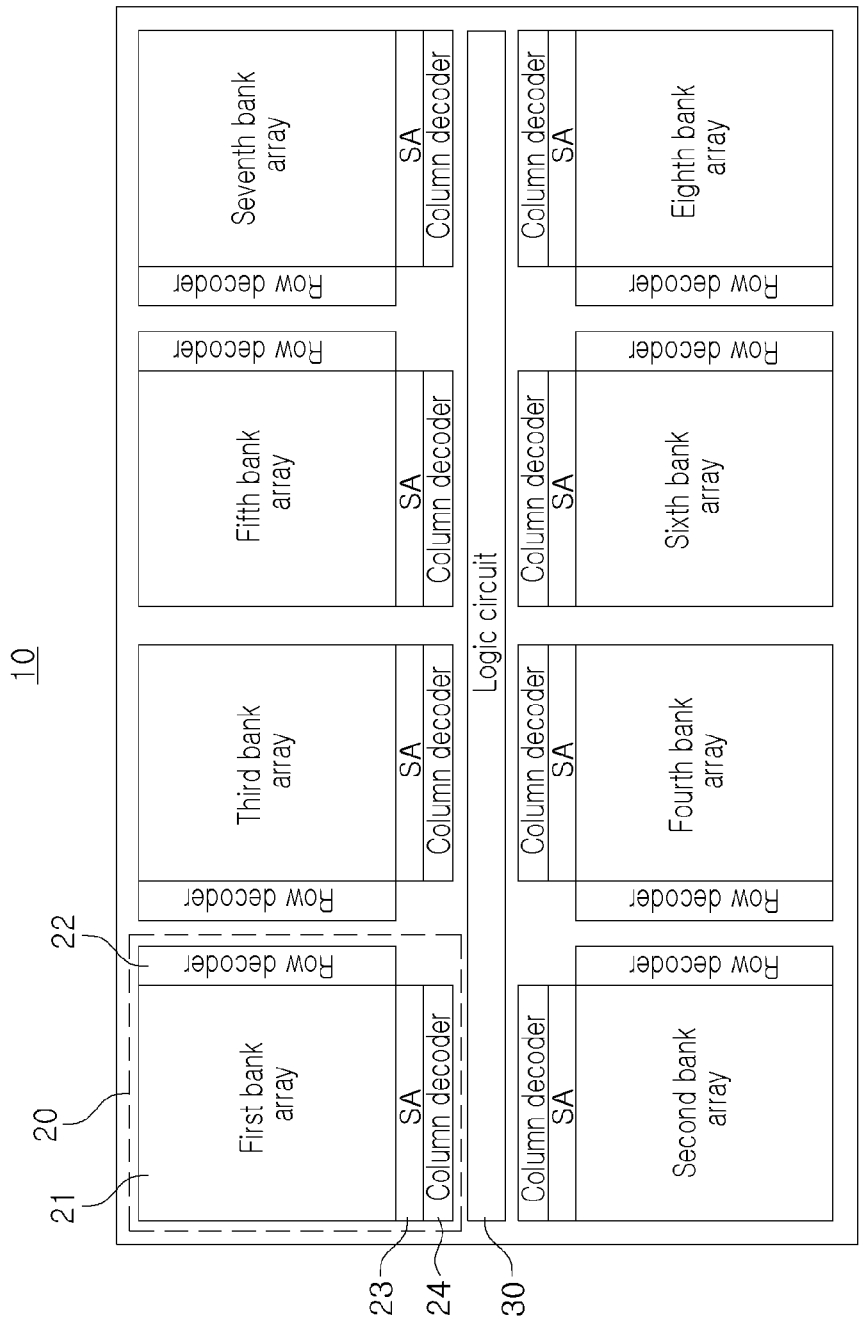

FIGS. 1 and 2 are diagrams illustrating a memory device according to an example embodiment of the disclosure.

Referring to FIG. 1, a memory module 1 according to an example embodiment of the disclosure may include a plurality of memory chips 2, a substrate 3 on which the plurality of memory chips 2 are mounted, and the like. Input/output (I/O) pins 4 for exchanging data may be provided at one end of the substrate 3. The plurality of memory chips 2 may receive data through the I/O pins 4 and store the received data or may output data through the I/O pins 4. Although one memory module 1 is illustrated as including eight memory chips 2 in FIG. 1, the number of memory chips 2 may vary depending on a data storage capacity to be provided by the memory module 1 and a data storage capacity of each of the memory chips 2.

An I/O bus connecting the memory chips 2 to the I/O pins 4 may be provided on the substrate 3, and the memory chips 2 may share the I/O bus. The I/O pins 4 may be connected to respective data I/O paths (e.g., DQ paths) of the plurality of memory chips 2.

Referring to FIG. 2, a memory device 10 according to an example embodiment may include a memory bank 20 and a logic circuit 30. The memory bank 20 may include a bank array 21 having a plurality of memory cells, a row decoder 22, a sense amplifier 23, a column decoder 24, and the like. In an example embodiment, the memory device 10 may include a plurality of memory banks 20.

A plurality of memory banks 20 included in the memory device 10 may share one logic circuit 30. The logic circuit 30 may read data from and/or write data to the memory banks 20. Alternatively or additionally, the logic circuit 30 may designate an address to store data or determine an operation mode of the memory device 10. Alternatively or additionally, the logic circuit 30 may include an I/O pad for transmitting data to be stored in the plurality of memory banks 20 and/or data output from the plurality of memory banks 20. The bank array 21 may include a memory cell array having a plurality of memory cells.

Memory devices produced and released from a production line may be transported by aircraft. Aircraft may fly at a fixed altitude from the ground, so they may be more affected by radiation, compared to land transport and sea transport. The amount of radiation to which the aircraft is exposed may be determined according to a latitude and a longitude of a route the aircraft travels, and an altitude of the aircraft.

Thermal neutrons, high-speed neutrons, and the like are generated by the radiation, and at least some of the materials included in the memory device transported by the aircraft may absorb the neutrons, thereby causing nuclear fission. Particles may be produced as a result of the nuclear fission. The generated particles may move in the semiconductor device and collide with silicon included in the memory device to cause damage, and vacancy defects may occur due to the damage. Due to the vacancy defects, characteristics of the semiconductor device (e.g., resistance of the semiconductor device) may change, and as a result, defects may occur in the memory device and/or the semiconductor device including the memory device.

According to an example embodiment of the disclosure, a memory device including a structure capable of shielding a memory device from external neutrons and particles generated thereby, and a method of manufacturing the memory device are proposed.

Figure 3:
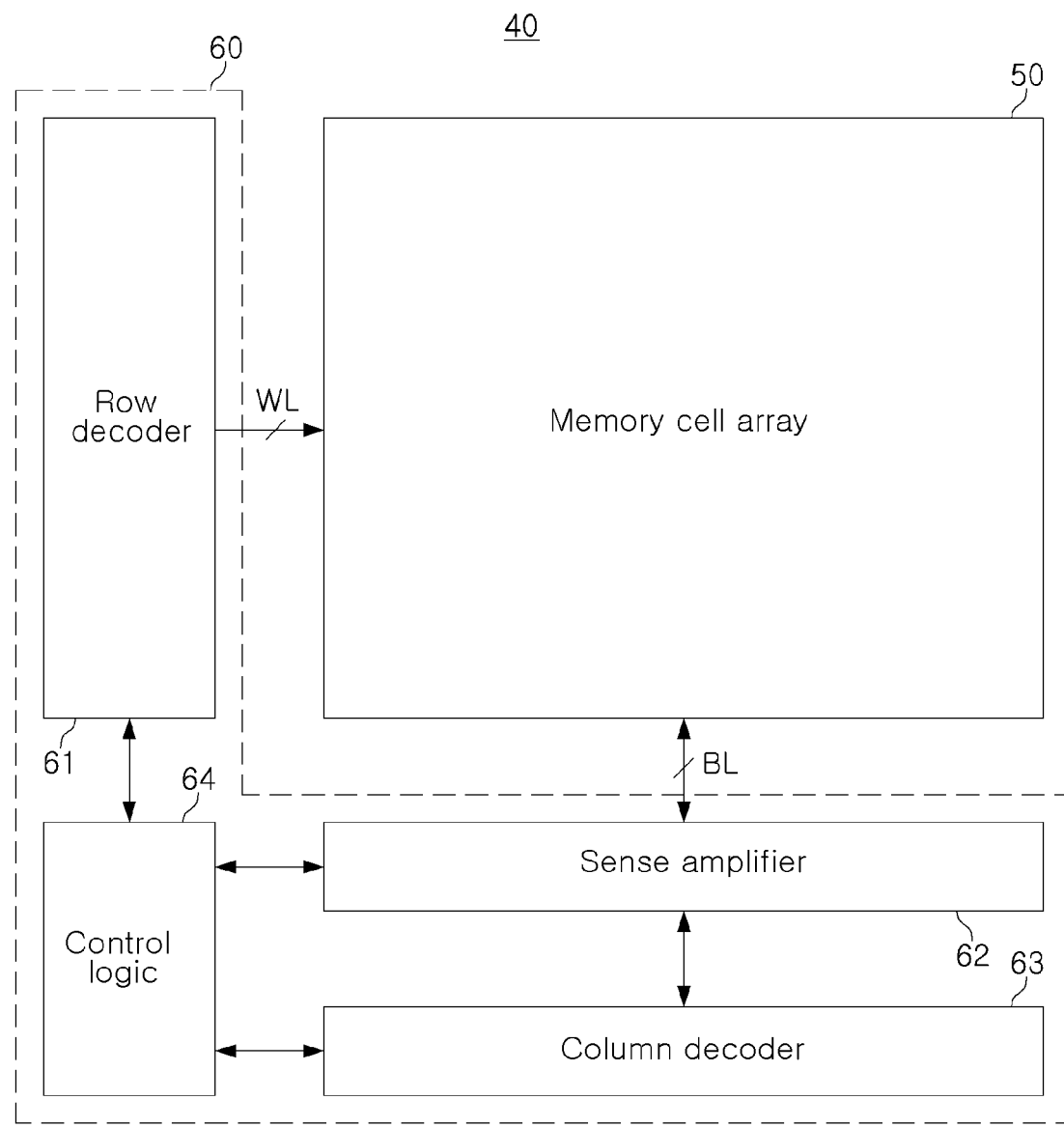
FIG. 3 is a block diagram schematically illustrating a memory device according to an example embodiment of the disclosure.

FIG. 3 is a block diagram illustrating a memory device according to an example embodiment of the disclosure.

Referring to FIG. 3, a memory device 40 according to an example embodiment may include a memory cell array 50 and a controller 60. The controller 60 may include a row decoder 61, a sense amplifier 62, a column decoder 63, a control logic 64, and the like. The memory cell array 50 may include a plurality of memory cells.

In an example embodiment, the row decoder 61 may be connected to the memory cells through a word line WL, and the sense amplifier 62 may be connected to the memory cells through a bit line BL. In an example embodiment, the row decoder 61 may select a memory cell to which data is written and/or from which data is read, and the sense amplifier 62 may write data to and/or read data from the memory cell through the bit line. The column decoder 63 may transmit data to be written to the sense amplifier 62 and/or may transfer data read by the sense amplifier 62 from the memory cell array 50 to the control logic 64. The control logic 64 may control an operation of the row decoder 61, the sense amplifier 62, and the column decoder 63.

The memory cell array 50 may include volatile memory cells. For example, the memory cells may be dynamic random access memory (DRAM) cells.

Figure 4:
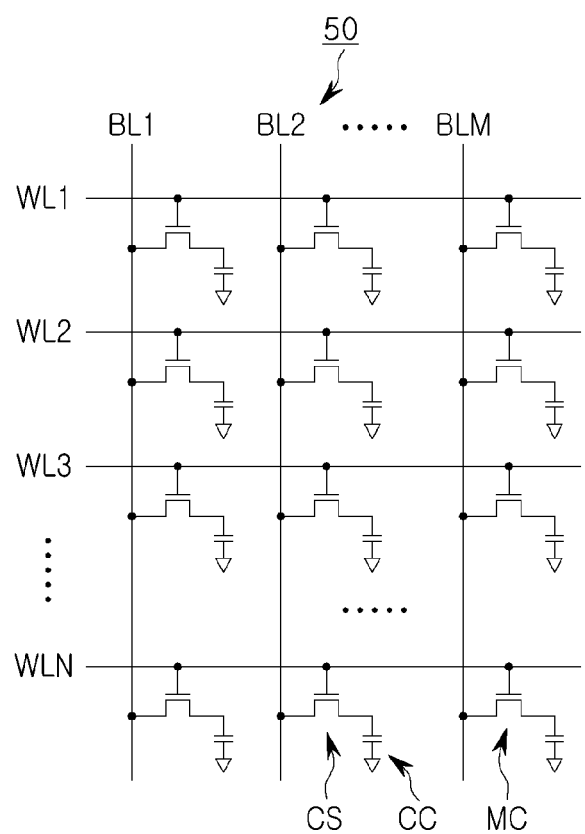
FIG. 4 is a circuit diagram illustrating a memory cell array of a memory device according to an example embodiment of the disclosure.

FIG. 4 depicts a circuit diagram illustrating a memory cell array of a memory device according to an example embodiment of the disclosure.

Referring to FIG. 4, the memory cell array 70 of the memory device according to an example embodiment of the disclosure may include memory cells MC, and the memory cells MC may be connected to word lines WL1 to WLN and to bit lines BL1 to BLM, where N and M are positive integers greater than zero.

Each of the memory cells MC may include a cell switch CS and a cell capacitor CC. When a cell switch CS is turned on by a control voltage input to the word lines WL1 to WLN, data may be written and/or deleted as a cell capacitor CC is charged and/or discharged by a voltage input to the bit lines BL1 to BLM. A refresh operation for preventing data loss due to leakage current of the cell capacitor CC may be performed in the memory cell array 50.

Figure 5:
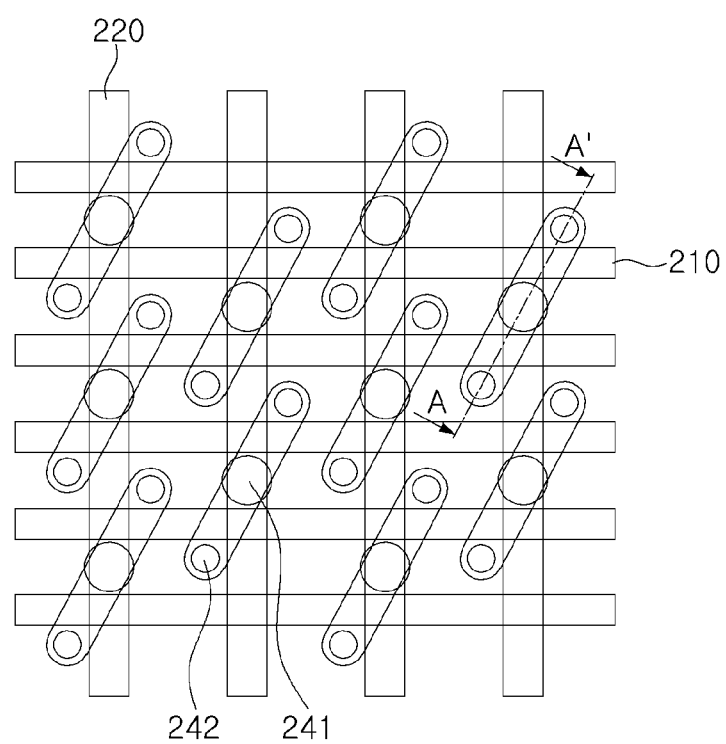
FIG. 5 is a schematic plan view of a memory cell array of a memory device according to an example embodiment of the disclosure.
Figure 6:
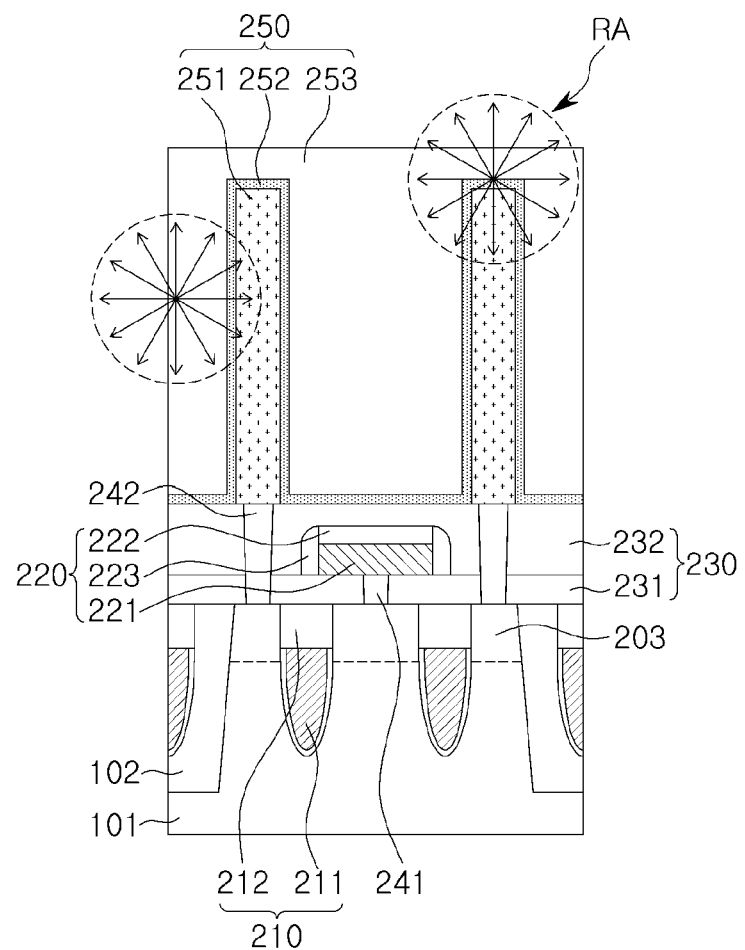
FIG. 6 is a cross-sectional view of the memory cell array illustrated in FIG. 5, taken along line A-A'.

FIG. 5 is a schematic plan view of a memory cell array of a memory device according to an example embodiment of the disclosure. FIG. 6 is a cross-sectional view of the memory cell array illustrated in FIG. 5, taken along line A-A'.

Referring to FIGS. 5 and 6, a memory device 100 according to an example embodiment of the disclosure may include a substrate 101, and the substrate 101 may include a first region 200. The first region 200 may include a memory cell array in which memory cells are formed.

Referring to FIG. 6, in the first region 200, a first active region 203 defined between device separation layers 102, a gate structure 210 providing a word line, a bit line structure 220 connected to at least a portion of the first active region 203, a cell capacitor 250, and the like, may be formed. The gate structure 210 may cross the first active region 203 and the bit line structure 220 and may be embedded in the substrate 101. However, the disclosure is not limited thereto, and the gate structure 210 may be formed on the substrate 101.

The gate structure 210 may include a gate electrode layer 211 and a capping layer 212. The gate electrode layer 211 may be formed of a conductive material such as a metal or a metal compound, and the capping layer 212 may be formed of an insulating material such as silicon nitride, for example. A gate insulating layer 205 may be disposed between the gate electrode layer 211 and the substrate 101, and the gate insulating layer 205 may be formed of silicon oxide or the like.

The first active region 203 may be doped with an impurity and may provide a source region and a drain region of a cell switch included in a memory cell. The active region 203 disposed between the gate structure 210 and the device separation layer 102 may be connected to the cell capacitor 250 through a second contact 242. Alternatively or additionally, the first active region 203 disposed between a pair of adjacent gate structures 210 may be connected to the bit line structure 220 through a first contact 241.

The bit line structure 220 may be embedded in an intermediate insulating layer 230 together with the first contact 241 and the second contact 242. The intermediate insulating layer 230 may include a first insulating layer 231 and a second insulating layer 232. The bit line structure 220 may include a bit line conductive layer 221, a bit line capping layer 222, a spacer layer 223, and the like.

The cell capacitor 250 may be connected to the first active region 203 through the second contact 242, and may include a first lower electrode layer 251, a first dielectric layer 252, and a first upper electrode layer 253. The cell capacitor 250 may extend in a direction, perpendicular to the surface of the substrate 101. The first lower electrode layer 251 may have a column shape as illustrated in FIG. 6 and/or a hollow cylindrical shape.

If or when the cell capacitors 250 of the memory cell array are not shielded from neutrons generated by external radiation, defects may occur in the cell capacitors 250 due to the external neutrons. FIG. 6 illustrates a fission reaction (e.g., RA) that may occur in the cell capacitors 250 due to external neutrons when the cell capacitors 250 are not shielded.

In the process of transporting the memory device, there may be radiation in the vicinity, so that neutrons may be incident to the memory device. Neutrons incident to the memory device may be absorbed by a material having a high neutron absorption rate, among materials included in the memory device (e.g., boron-10 or the like) to cause a nuclear fission reaction RA. For example, as illustrated in FIG. 6, the nuclear fission reaction RA may occur in silicon germanium constituting the first upper electrode layer 253 of the cell capacitor 250, thereby generating particles. While the particles generated by the nuclear fission reaction RA move, the particles may collide with nuclei of semiconductor materials such as silicon and silicon germanium to cause damage.

According to an example embodiment of the disclosure, the memory device may include dummy capacitors formed on side surfaces of the cell capacitors 250. The dummy capacitors may include a conductive material and may effectively block neutrons incident to the side surface of the memory cell array and particles generated by the nuclear fission reaction RA. Accordingly, the cell capacitors 250 may be protected from neutrons and particles, and the occurrence of defects in the cell capacitors 250 may be suppressed.

Hereinafter, a memory device according to an example embodiment of the disclosure is described in more detail with reference to FIGS. 7 to 26.

Figure 7:
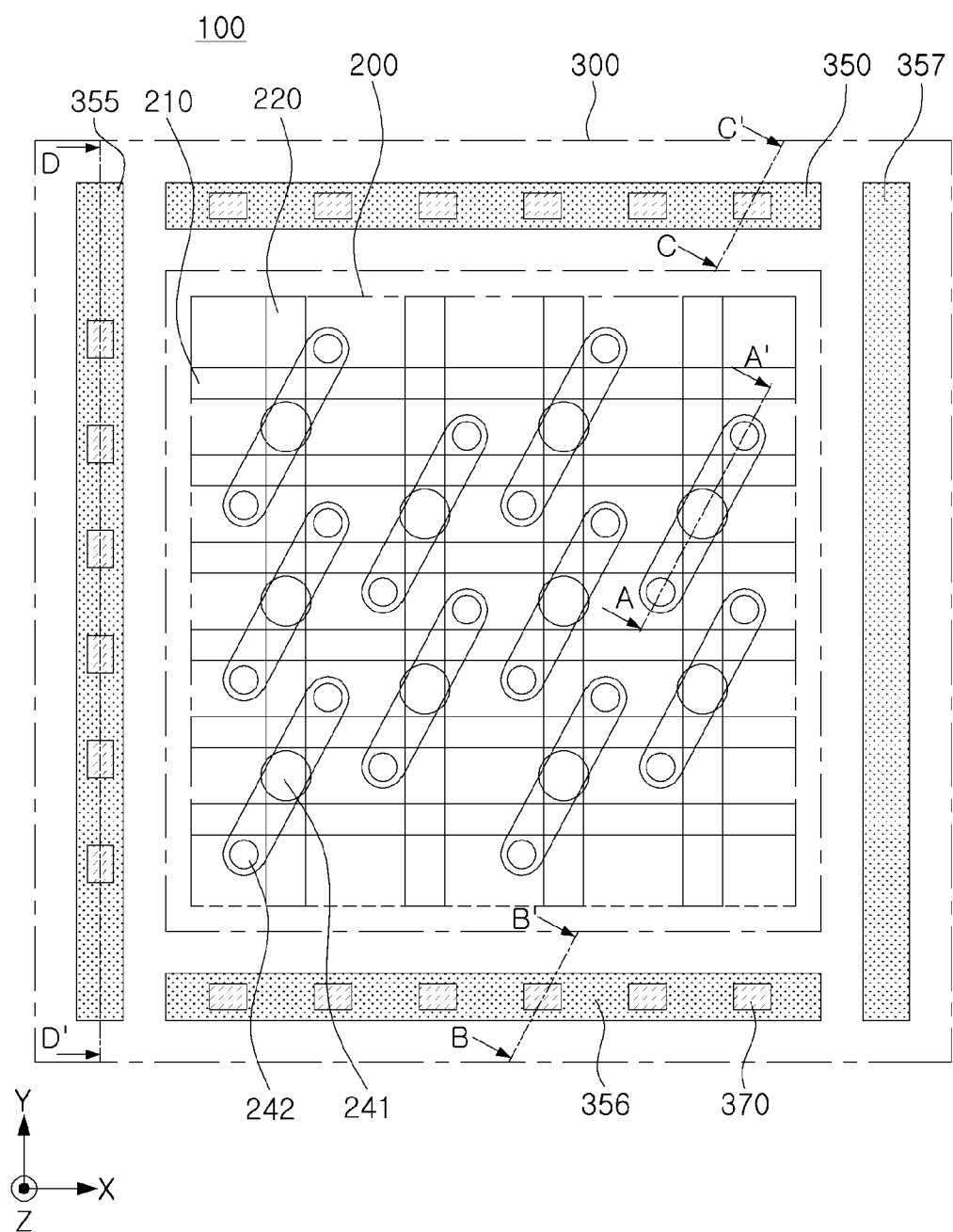
FIG. 7 is a plan view of a memory device according to an example embodiment of the disclosure.
Figure 8:
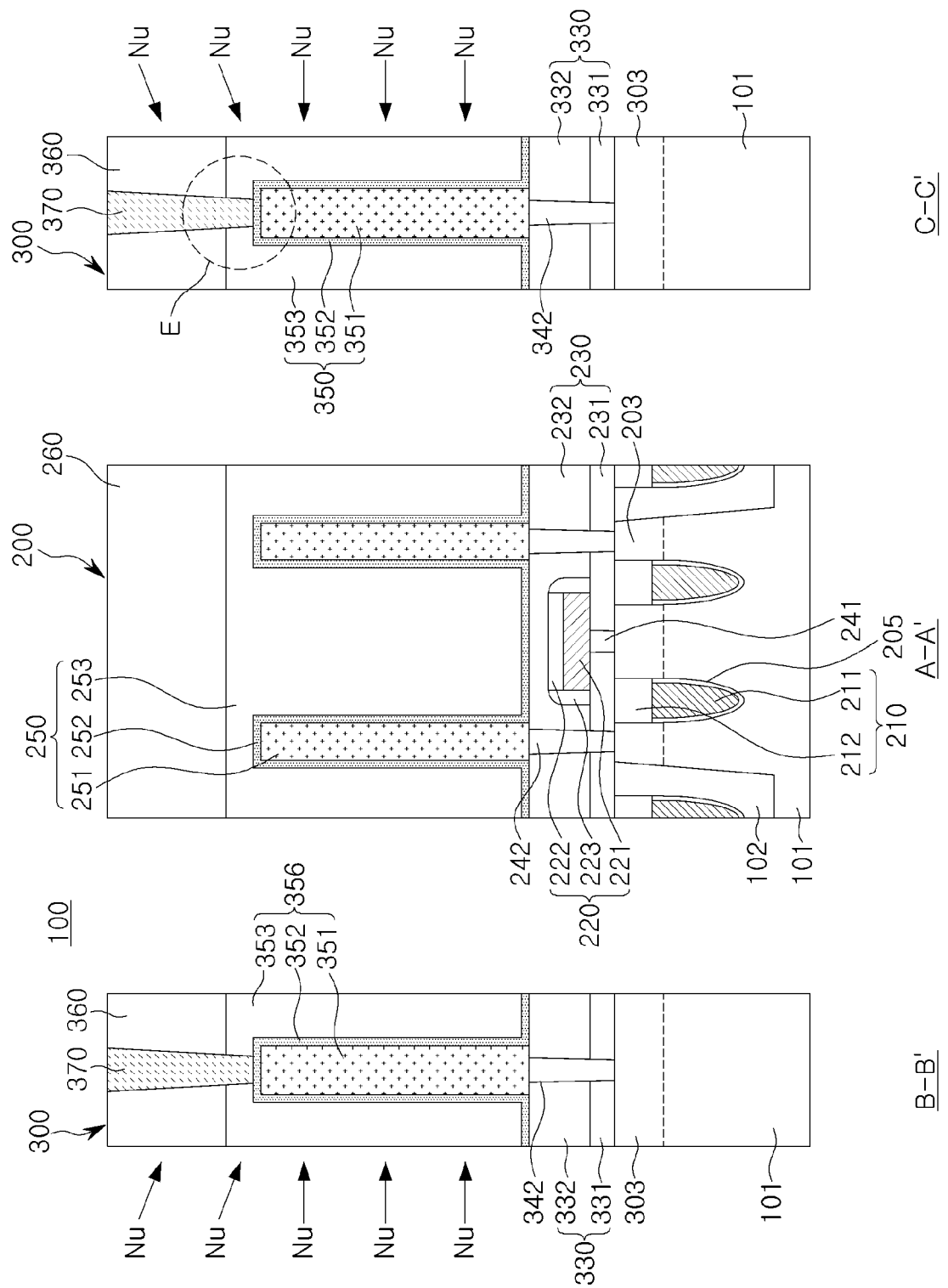
FIG. 8 is a cross-sectional view of the plan view of FIG. 7, taken along lines A-A', B-B', and C-C'.
Figure 9:
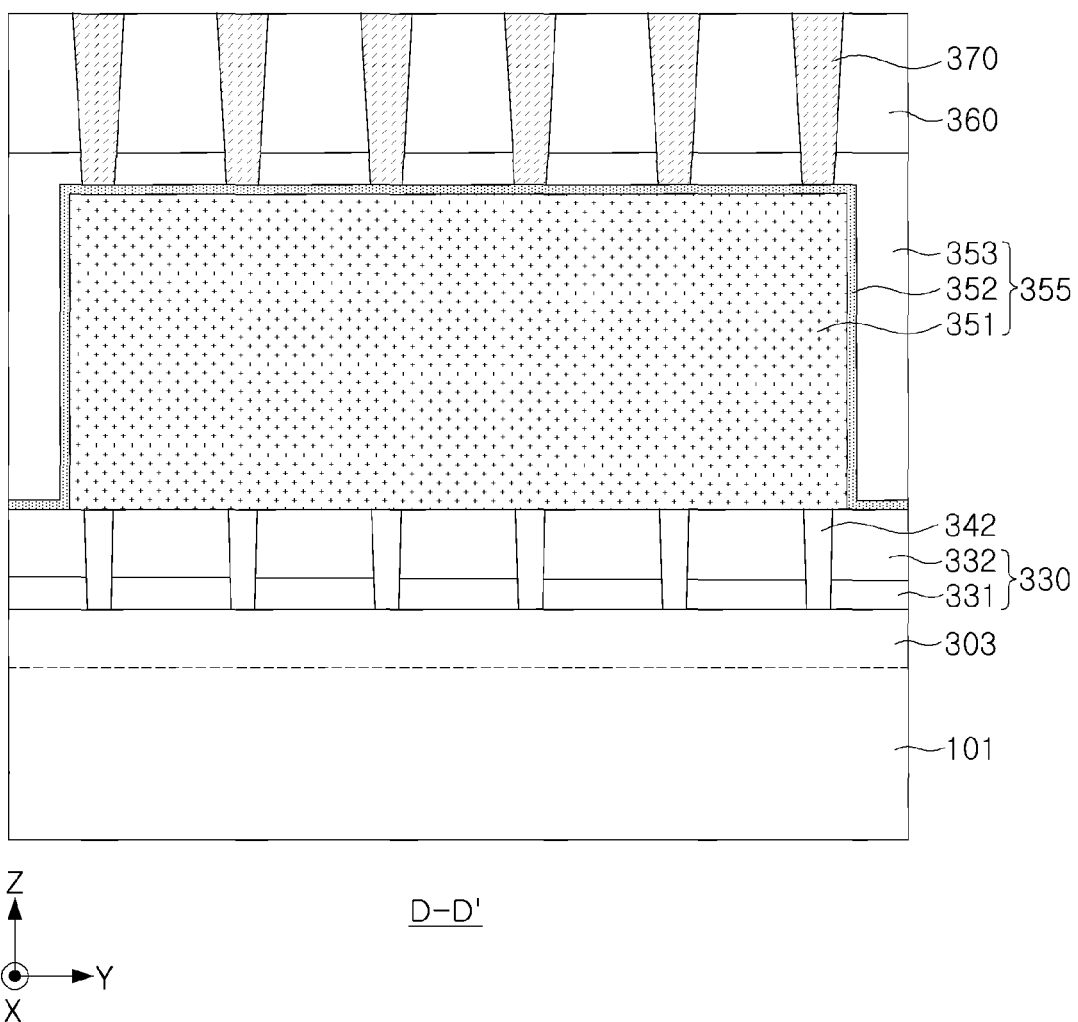
FIG. 9 is a cross-sectional view of the plan view of FIG. 7, taken along line D-D'.
Figure 10A:
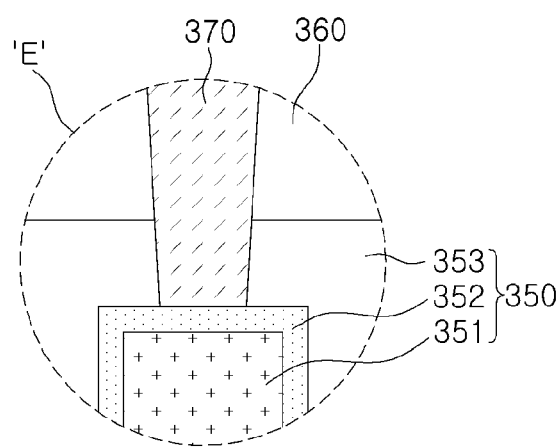
FIGS. 10A and 10B are enlarged views of a portion 'E' in the cross-sectional view of FIG. 8.
Figure 10B:
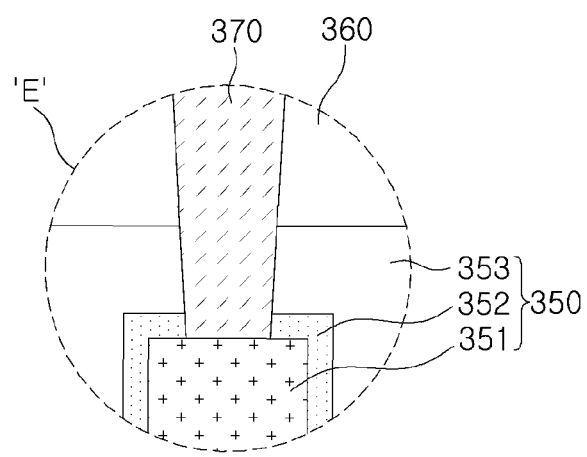

FIGS. 7 to 10B are diagrams illustrating the memory device 100 according to an example embodiment of the disclosure. FIG. 7 is a plan view of a memory device according to an example embodiment of the disclosure, FIG. 8 is a cross-sectional view of the plan view of FIG. 7, taken along lines A-A', B-B', and C-C', FIG. 9 is a cross-sectional view of the plan view of FIG. 7, taken along line D-D', and FIGS. 10A and 10B are enlarged views of a portion 'E' in the cross-sectional view of FIG. 8.

Referring to FIGS. 7 and 8, the memory device 100 according to an example embodiment of the disclosure may include the substrate 101, and the substrate 101 may include a first region 200 and a second region 300 surrounding the first region 200.

As described above with reference to FIGS. 5 and 6, the gate structure 210, the bit line structure 220, the intermediate insulating layer 230, and the cell capacitor 250 may be disposed in the first region 200. In addition, a first upper insulating layer 260 may be further disposed on an upper surface of the cell capacitor 250.

Referring to FIGS. 7 and 8, a second active region 303 formed on the substrate 101 may be disposed in the second region 300. Referring to FIG. 7, first to fourth dummy capacitors 350, 355, 356, and 357 may be disposed on the active region 303 to surround the first region 200. Referring to FIG. 8, the first to fourth dummy capacitors 350, 355, 356, and 357 may be disposed on an upper surface of a third contact 342, and an upper contact 370 may be disposed on the first to fourth dummy capacitors 350, 355, 356, and 357.

The first to fourth dummy capacitors 350, 355, 356, and 357 may extend in a third direction Z perpendicular to the surface of the substrate 101. For example, FIG. 8 illustrates the first and second dummy capacitors 350 and 356 extending in the third direction Z, and FIG. 9 illustrates the third dummy capacitors 355 extending in the third direction Z. Referring to FIGS. 7 and 8, the first and second dummy capacitors 350 and 356 may be adjacent to the first region 200 in a second direction Y parallel to the surface of the substrate 101. The first region 200 may be disposed between the first and second dummy capacitors 350 and 356. Alternatively or additionally, the first and second dummy capacitors 350 and 356 may further extend not only in the third direction Z but also in the first direction X parallel to the surface of the substrate 101.

Similarly, referring to FIG. 7, the third and fourth dummy capacitors 355 and 357 may be adjacent to the first region 200 in the first direction X parallel to the surface of the substrate 101. The first region 200 may be disposed between the third and fourth dummy capacitors 355 and 357. In addition, the third and fourth dummy capacitors 355 and 357 may further extend not only in the third direction Z but also in the second direction Y.

Referring to FIG. 8, the second active region 303 may be doped with impurities. For example, the second active region 303 may be doped with the same material as that of the first active region 203.

The first to fourth dummy capacitors 350, 355, 356, and 357 may include a second lower electrode layer 351, a second dielectric layer 352, and a second upper electrode layer 353. FIGS. 8 and 9 illustrate structures of the first and second dummy capacitors 350 and 356. The second lower electrode layer 351 may contact the third contact 342. As the second lower electrode layer 351 contacts the third contact 342, the first dummy capacitor 350 and the second dummy capacitor 355 may be connected to the second active region 303.

The second lower electrode layer 351, the second dielectric layer 352, and the second upper electrode layer 353 may be formed of the same material as those of the first lower electrode layer 251, the first dielectric layer 252, and the first upper electrode layer 253, respectively. For example, the lower electrode layers 251 and 351 may be formed of a conductive material such as a metal or a metal compound. In addition, the dielectric layers 252 and 352 may be formed of a high-k material and/or a low-k material. For example, the dielectric layers 252 and 352 may include gadolinium, cadmium, or the like. The upper electrode layers 253 and 353 may be formed of a doped semiconductor material, for example, silicon germanium.

The first to fourth dummy capacitors 350, 355, 356, and 357 may extend from upper surfaces of first and second insulating layers 331 and 332 in the third direction Z, perpendicular to the upper surface of the substrate 101. In addition, a distance at which the first to fourth dummy capacitors 350, 355, 356, and 357 are spaced apart from the substrate 101 in the third direction Z may be equal to a distance at which the cell capacitors 250 are spaced apart from the substrate 101 in the third direction Z.

The first to fourth dummy capacitors 350, 355, 356 and 357 surrounding the cell capacitors 250 may shield the cell capacitors 25 from externally incident neutrons Nu and particles generated by nuclear fission. Referring to FIG. 8, the first and second dummy capacitors 350 and 356 may block neutrons and the particles incident in the first direction X. For example, the lower electrode layer 351 formed of a conductive material may physically block neutrons and non-polarized particles and may absorb charges of polarized particles. Similarly, the third and fourth dummy capacitors 356 and 357 may block neutrons and particles incident in the second direction Y.

Meanwhile, although FIG. 8 illustrates a case in which the lower electrode layers 351 of the first and second dummy capacitors 350 and 356 have a columnar shape, the disclosure is not limited thereto. According to implementation, the first to fourth dummy capacitors 350, 355, 356, and 357 may have a columnar shape and/or a hollow cylindrical shape.

FIG. 8 illustrates a case in which the lower electrode layer 351 of the first and second dummy capacitors 350 and 356 and the lower electrode layer 251 of the cell capacitor 250 have the same length in the third direction Z, but the disclosure is not limited thereto. According to an implementation, the lower electrode layer 351 of the first to fourth dummy capacitors 350, 355, 356 and 357 may have the same length as the lower electrode layer 251 in the third direction Z and/or may have a length longer or shorter than that of the lower electrode layer 251 in the third direction Z. Alternatively or additionally, a thickness of the lower electrode layer 351 is not limited.

Referring to FIGS. 8 and 9, a second upper insulating layer 360 may be disposed on upper surfaces of the first and second dummy capacitors 350 and 356 and the third dummy capacitor 355. Similarly, the second upper insulating layer 360 may be disposed on an upper surface of the fourth dummy capacitor 357. Alternatively or additionally, upper contacts 370 penetrating through the second upper insulating layer 360 and the second upper electrode layer 353 may be disposed in a position overlapping the second lower electrode layer 351 of the first to third dummy capacitors 350, 355, and 357 in the third direction Z. The upper contacts 370 may be formed of a conductive material, for example, the same material as that of the second lower electrode layer 351. The upper contacts 370 may function as an antenna for absorbing polarized particles.

Referring to FIG. 7, the upper contacts 370 may not be formed on the fourth dummy capacitor 357. A wiring pattern (not shown) connecting the cell capacitors 250 to the ground may extend from an upper portion of the fourth dummy capacitor 357.

FIG. 10A is an enlarged view of a region 'E' of FIG. 8. Referring to FIG. 10A, the upper contact 370 may contact an upper surface of the second dielectric layer 352, without passing through the second dielectric layer 352. The upper contact 370 may absorb charges of polarized particles and trap the charges inside the upper contact 370, thereby effectively shielding the cell capacitors 250. However, the disclosure is not limited thereto.

FIG. 10B is an enlarged view illustrating another example embodiment of region 'E' of FIG. 8. Referring to FIG. 10B, the upper contact 370 may penetrate through the second dielectric layer 352 to contact the second lower electrode layer 351. The upper contact 370 may absorb charges of polarized particles and allow the charges to flow to the second lower electrode layer 351.

Figure 11:
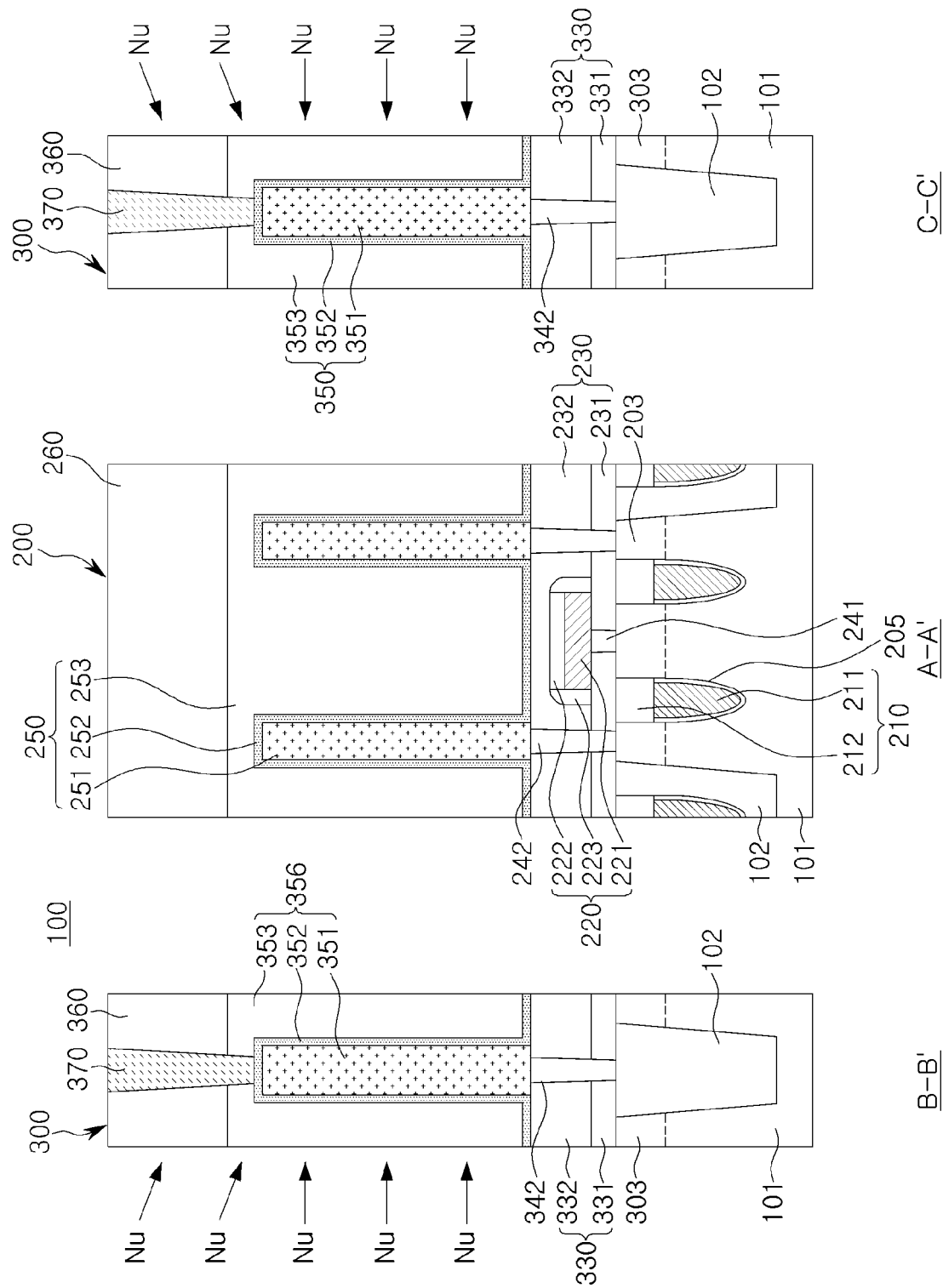
FIG. 11 is a cross-sectional view of the plan view of FIG. 7, taken along lines A-A', B-B', and C-C'.
Figure 12:
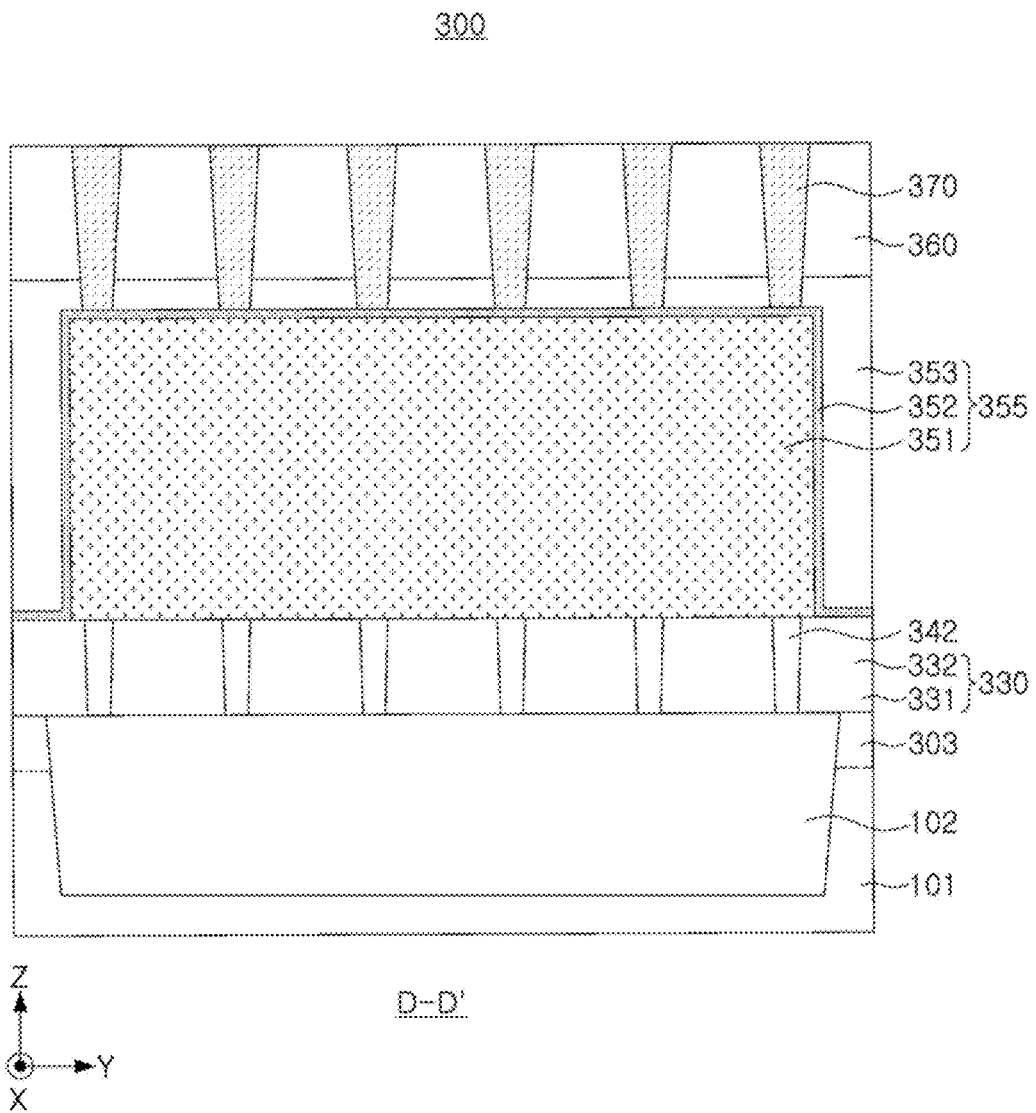
FIG. 12 is a cross-sectional view of the plan view of FIG. 7, taken along line D-D'.

FIGS. 11 and 12 are cross-sectional views of the memory device 100 according to an example embodiment of the disclosure. FIG. 11 is a cross-sectional view of the plan view of FIG. 7, taken along lines A-A', B-B', and C-C', and FIG. 12 is a cross-sectional view of the plan view of FIG. 7, taken along line D-D'.

Like the example embodiment described above with reference to FIGS. 8 to 10B, in the example embodiment illustrated in FIGS. 11 and 12, the memory device 100 may include the first to fourth dummy capacitors 350, 355, 356, and 357 surrounding the cell capacitors 25 of the first region 200.

However, according to the example embodiments illustrated in FIGS. 11 and 12, the first to fourth dummy capacitors 350, 355, 356, and 357 may be electrically separated from the second active region 303. For example, the device separation layer 102 may be formed in the second region 300 of the substrate 101, and the second active region 303 may be formed on a side surface of the device separation layer 102. The third contact 342 may be formed on an upper surface of the device separation layer 102, and first to fourth dummy capacitors 350, 355, 356 and 357 may be formed on the upper surface of the third contact 342. FIG. 11 illustrates the first and second dummy capacitors 350 and 356 formed on the upper surface of the third contact 342, and FIG. 12 illustrates the third dummy capacitor 355 formed on the upper surface of the third contact 342.

According to the example embodiment illustrated in FIGS. 11 and 12, the first to fourth dummy capacitors 350, 355, 356, and 357 may not directly contact the silver substrate 101 and may be electrically separated from the second active region 303. Accordingly, the first to fourth dummy capacitors 350, 355, 356, and 357 may effectively block polarized particles and minimize the electrical influence of the particles.

Figure 13:
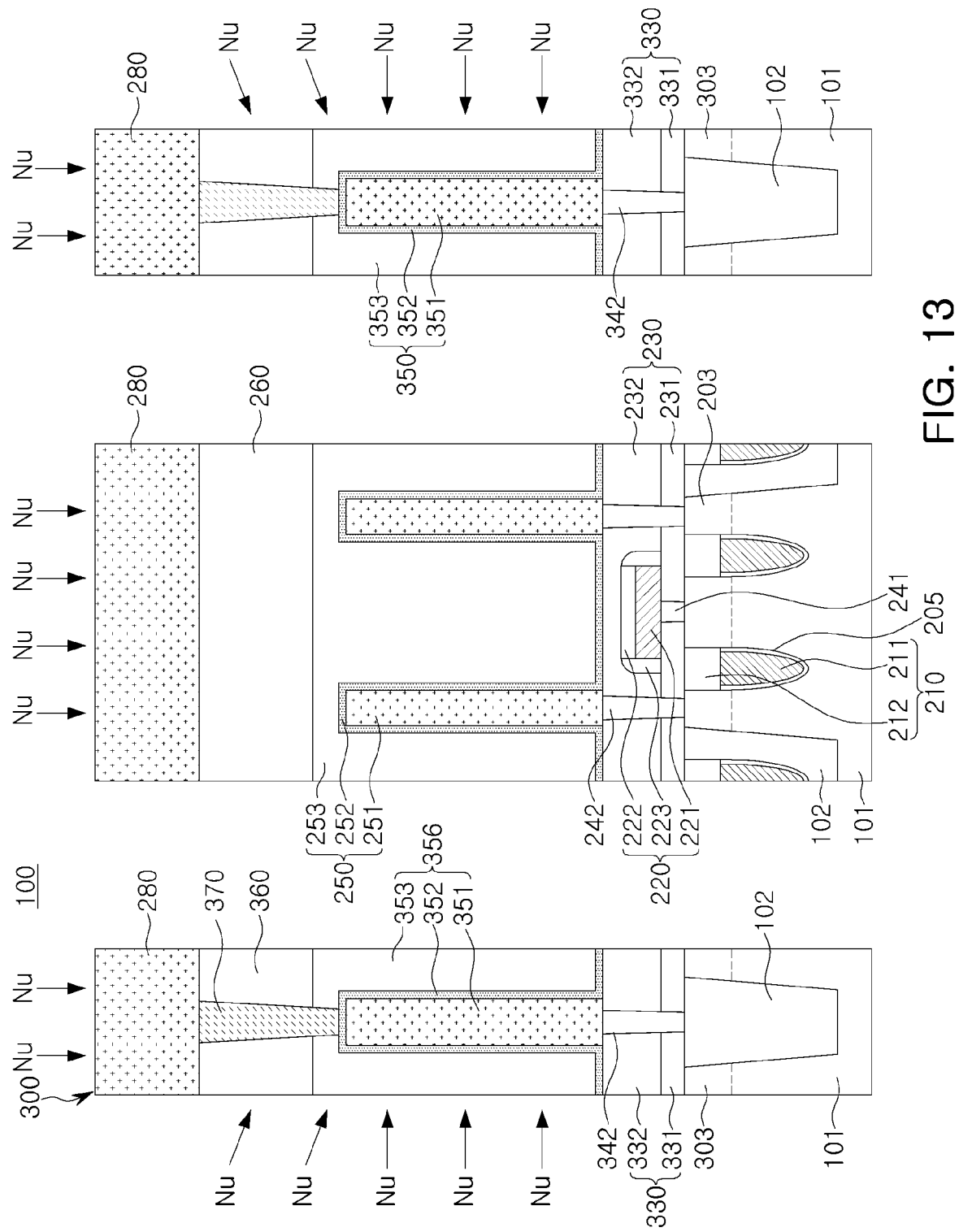
FIG. 13 is a cross-sectional view of the plan view of FIG. 7, taken along the A-A', B-B', and C-C'.

FIG. 13 is a cross-sectional view of the plan view of FIG. 7, taken along lines A-A', B-B', and C-C'.

Like the example embodiment described above with reference to FIGS. 11 and 12, in the example embodiment illustrated in FIG. 13, the memory device 100 may include first and second dummy capacitors 350 and 356 surrounding the cell capacitors 250 of the first region 200. In addition, the lower electrode layer 351 of the first and second dummy capacitors 350 and 356 may be electrically separated from the active region 303. Although not illustrated in FIG. 13, the third and fourth dummy capacitors 355 and 357 may also surround the cell capacitors 250 of the first region 200 and may be electrically separated from the active region 303.

According to the example embodiment of FIG. 13, an upper conductive layer 280 including a conductive material may be formed on the first upper insulating layer 260 and the second upper insulating layer 360. The upper conductive layer 280 may be in contact with the upper surfaces of the upper contacts 370, and the upper conductive layer 280 may be integrally formed above the first region 200 and the second region 300. According to an example embodiment of the disclosure, the upper conductive layer 280 may shield the cell capacitor 250 from neutrons (e.g., Nu) incident on the upper surface of the first region 200 and particles generated on the upper surface of the first region 200. As a result, the cell capacitors 250 may be effectively shielded by the dummy capacitors 350, 355, 356, and 357 and the upper conductive layer 280, and an occurrence of defects in the cell capacitors 250 may be suppressed.

FIGS. 14 to 22 are diagrams illustrating a method of manufacturing the memory device 100 according to an example embodiment of the disclosure. Specifically, FIGS. 14 to 22 may be diagrams illustrating a method of manufacturing the memory device 100 according to the example embodiment illustrated in FIG. 13. FIGS. 14 to 20A and FIGS. 21 and 22 are cross-sectional views taken along lines A-A', B-B', and C-C', and FIG. 20B may be a cross-sectional view taken along line D-D'. As described above, the substrate 101 may include the first region 200 in which memory cells are formed and the second region 300 in which dummy capacitors are formed.

Figure 14:
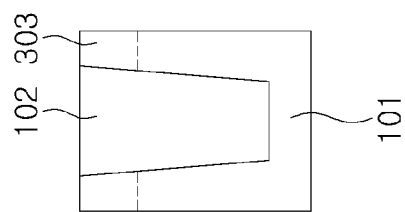
FIGS. 14 to 22 are diagrams provided to illustrate a method of manufacturing a memory device according to an example embodiment of the disclosure.

Referring to FIG. 14, the device separation layer 102 may be formed by removing at least a partial region of the substrate 101 by etching and filling the etched region with an insulating material. The device separation layer 102 may be formed over the entire substrate 101. For example, the device separation layer 102 may be simultaneously formed in the first region 200 and the second region 300.

After the device separation layer 102 is formed, impurities may be implanted into the first region 200 and the second region 300 to form the first active region 203 and the second active region 303. The first active region 203 and the second active region 303 may be doped with an impurity of the same conductivity type or may be doped with an N-type impurity in an example embodiment.

Figure 15:
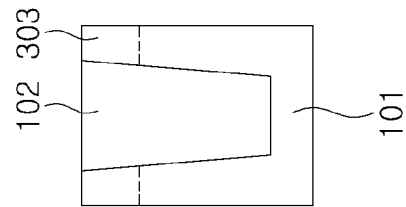
Figure 15:
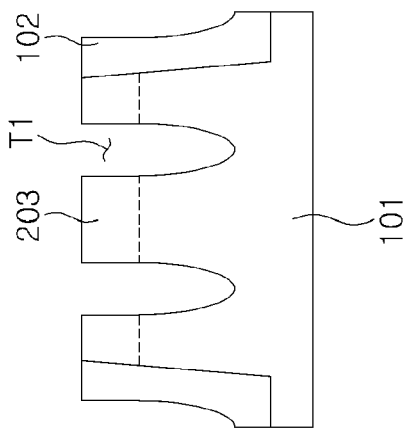
Figure 15:
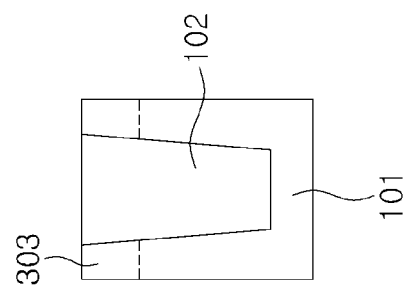

Referring to FIG. 15, at least a partial region of the substrate 101 may be etched in the region in which the first active region 203 is formed to form first trenches T1. The first trenches T1 may be simultaneously formed and may extend in the same direction in a direction, parallel to the upper surface of the substrate 101. Although it is illustrated that the second active region 303 is not etched in FIG. 15, the disclosure is not limited thereto. For example, the second active region 303 may be further etched to form a dummy device in the region in which the second active region 303 is formed.

Figure 16:
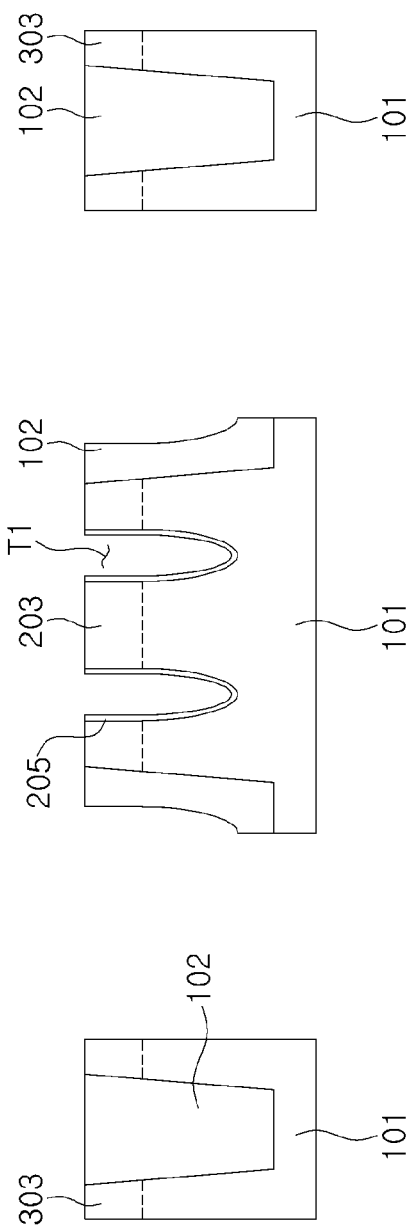

Referring to FIG. 16, the gate insulating layer 205 may be formed in the first trenches T1. The gate insulating layer 205 may be formed of an insulating material such as silicon oxide. The gate insulating layer 205 may be conformally formed along inner surfaces of the first trenches T1. The first trenches T1 may not be completely filled by the gate insulating layer 205.

Figure 17:
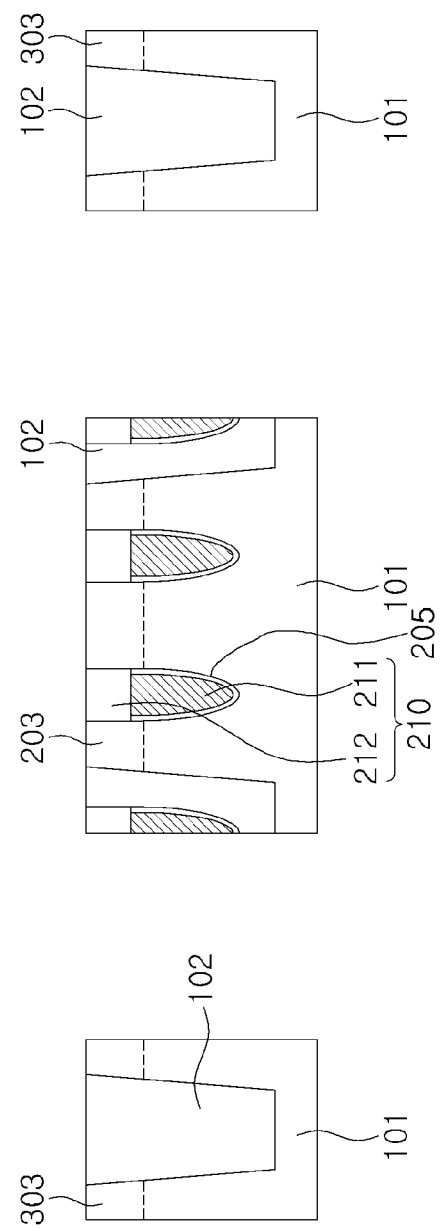

Referring to FIG. 17, the gate structures 210 may be formed in the first region 200. The gate electrode layer 211 may be formed by filling the first trenches T1 that are not filled by the gate insulating layer 205 with a conductive material such as tungsten. The gate structures 210 may be formed by forming the capping layer 212 with an insulating material such as silicon nitride on the gate electrode layer 211.

For example, the gate electrode layer 211 may be formed by filling a portion of an internal space of the gate insulating layer 205 with a conductive material such as tungsten. Thereafter, the gate insulating layer 205 on the gate electrode layer 211 may be removed by an etching process. The capping layer 212 may be formed by filling a space, from which the gate insulating layer 205 was removed, with silicon nitride or the like.

Figure 18:
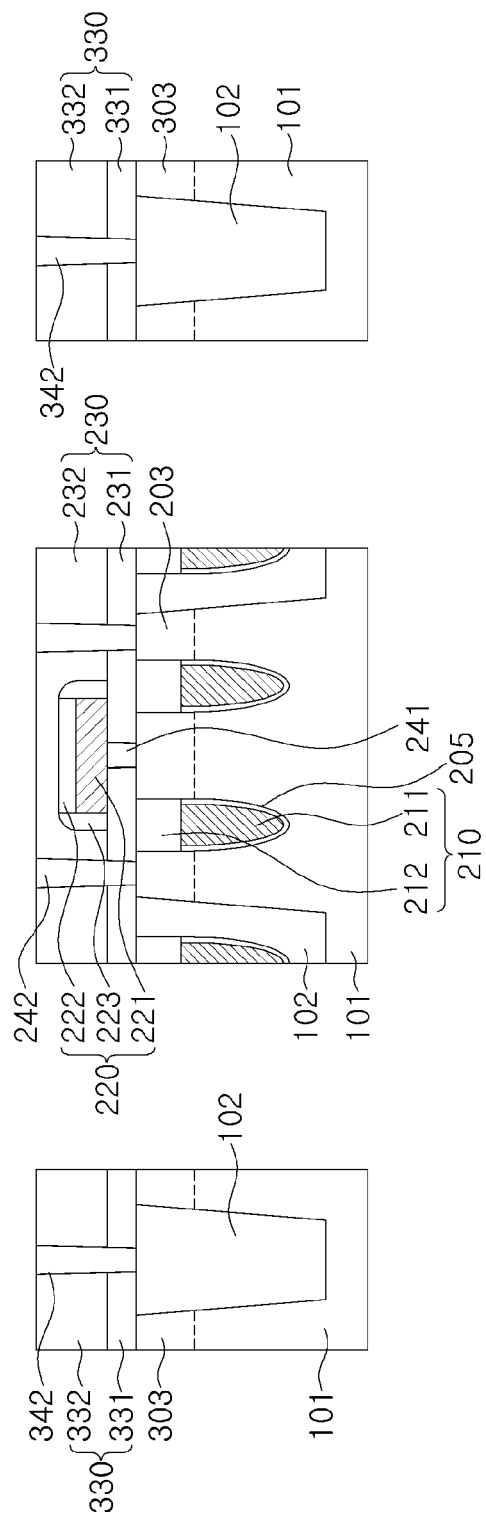

Referring to FIG. 18, the bit line structure 220 may be formed in the first region 200. Prior to forming the bit line structure 220, the first insulating layers 231 and 331 may be formed on the substrate 101 in the first region 200. The first contact 241 may be formed by etching a partial region of the first insulating layer 231 on the first active region 203 and filling the etched region with a conductive material.

When the first contact 241 is formed, the bit line structure 220 may be formed. The bit line structure 220 may include the bit line conductive layer 221, the bit line capping layer 222, the spacer layer 223, and the like, and may be embedded in the second insulating layer 232. The second insulating layer 332 may be further formed in the second region 300 at the same time when the second insulating layer 232 is formed. Partial regions of the first insulating layers 231 and 331 and the second insulating layers 232 and 332 may be etched on the first active region 203 and the second active region 303 and the etched regions may be filled with a conductive material to simultaneously form the second contacts 242 and the third contacts 342.

Figure 19:
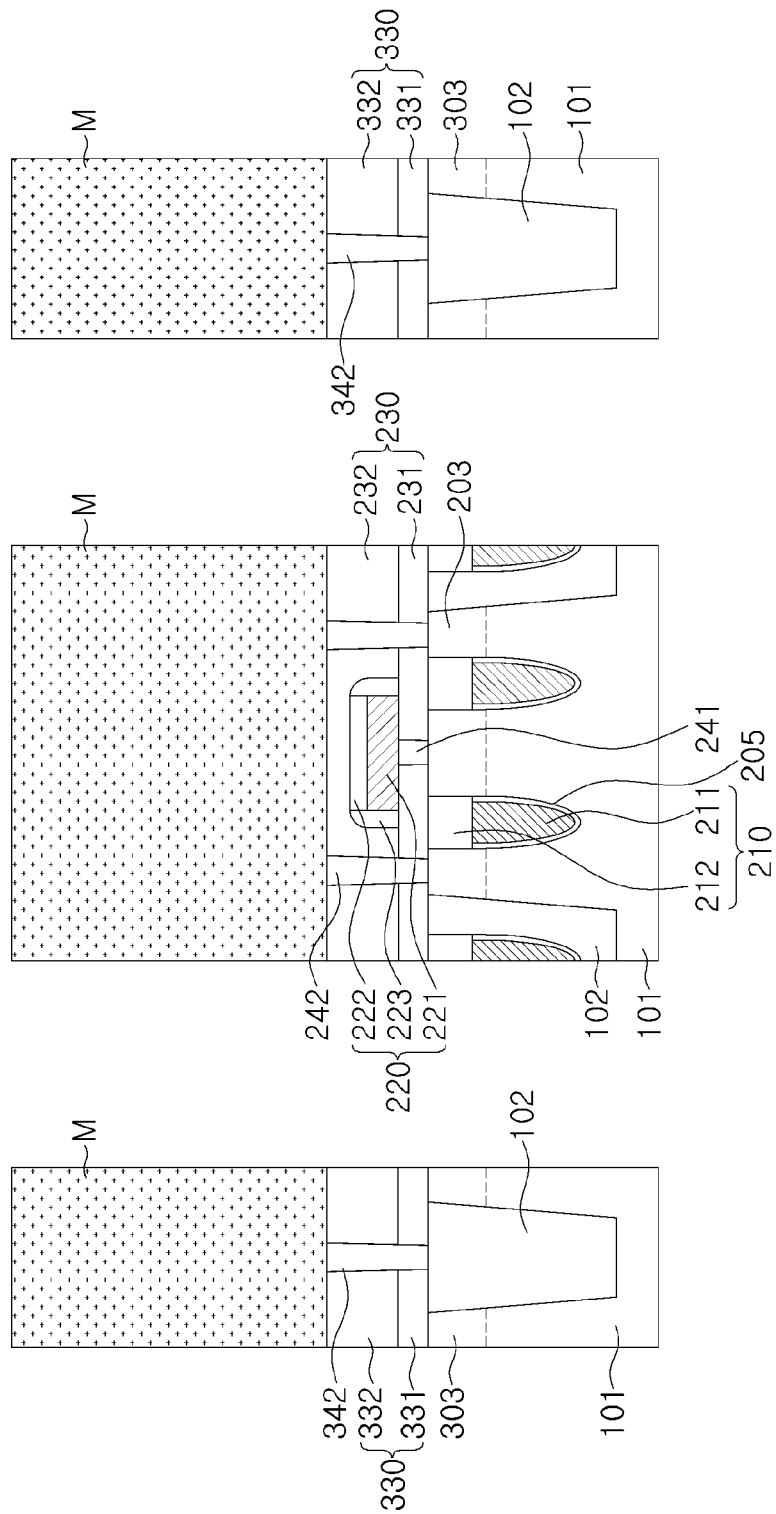
Figure 20A:
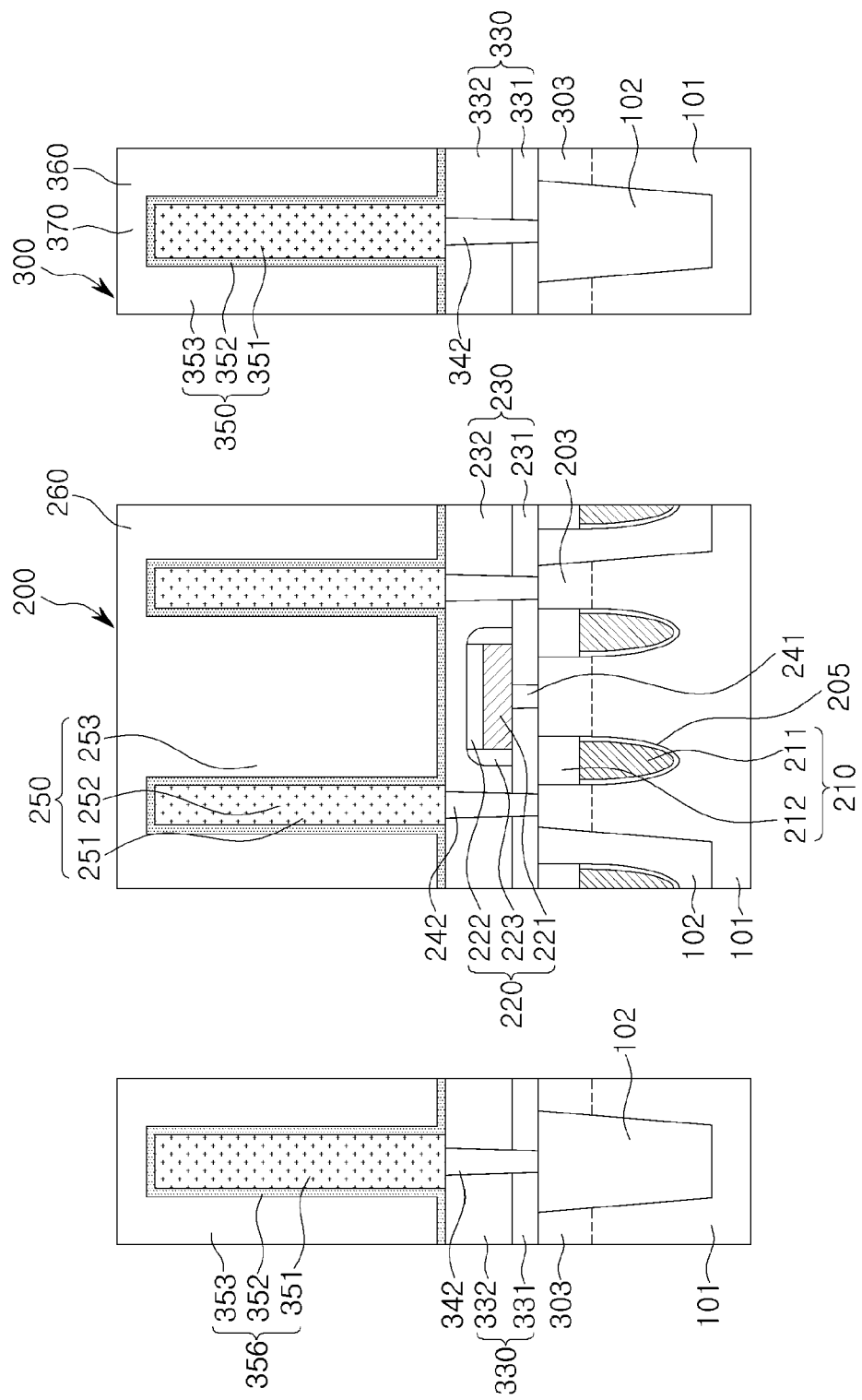
Figure 20B:
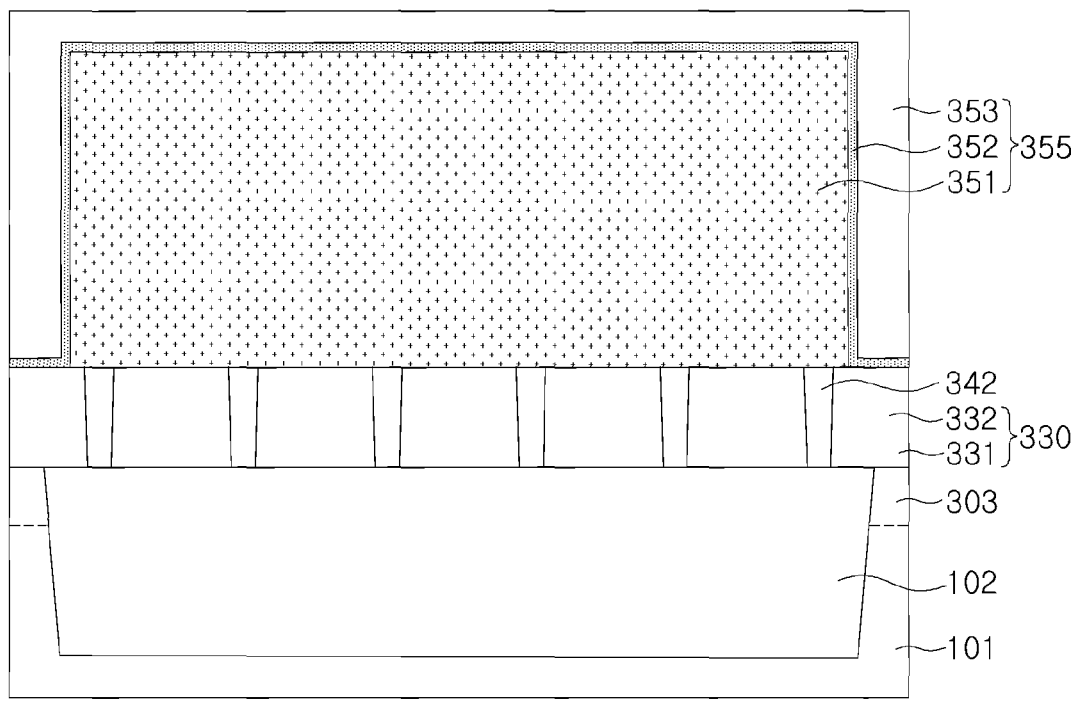

Referring to FIG. 19, a conductive material M may be formed on the second insulating layers 232 and 332. Referring to FIGS. 20A and 20B, the conductive material M may be etched to form the first lower electrode layer 251 in the first region 200 and the second lower electrode layer 351 in the second region 300. The first lower electrode layer 251 and the second lower electrode layer 352 may be simultaneously formed.

The first dielectric layer 252 covering the first lower electrode layer 251 and the second insulating layer 232 may be formed, and the second dielectric layer 352 covering the second lower electrode layer 351 and the second insulating layer 332 may be formed. In addition, the first upper electrode layer 253 covering the first dielectric layer 252 and the second upper electrode layer 353 covering the second dielectric layer 352 may be formed. According to an implementation, the first dielectric layer 252 and the second dielectric layer 352 may be integrally formed, and the first upper electrode layer 253 and the second upper electrode layer 353 may be integrally formed.

The first lower electrode layer 251, the first dielectric layer 252, and the first upper electrode layer 253 may constitute the cell capacitor 250, and the second lower electrode layer 351, the second dielectric layer 352, and the second upper electrode layer 353 may constitute the first to fourth dummy capacitors 350, 355, 356, and 357. FIG. 20A illustrates the first and second dummy capacitors 350 and 356.

Referring to FIG. 20B, unlike the first lower electrode layer 251 extending only in the third direction Z, perpendicular to the surface of the substrate, the second lower electrode layer 351 may extend in one direction, parallel to the surface of the substrate and the third direction Z. A region in which the second lower electrode layer 351 is formed may be covered with a mask layer extending in the one direction when the conductive material M is etched so that the second lower electrode layer 351 may extend in the one direction.

Figure 21:
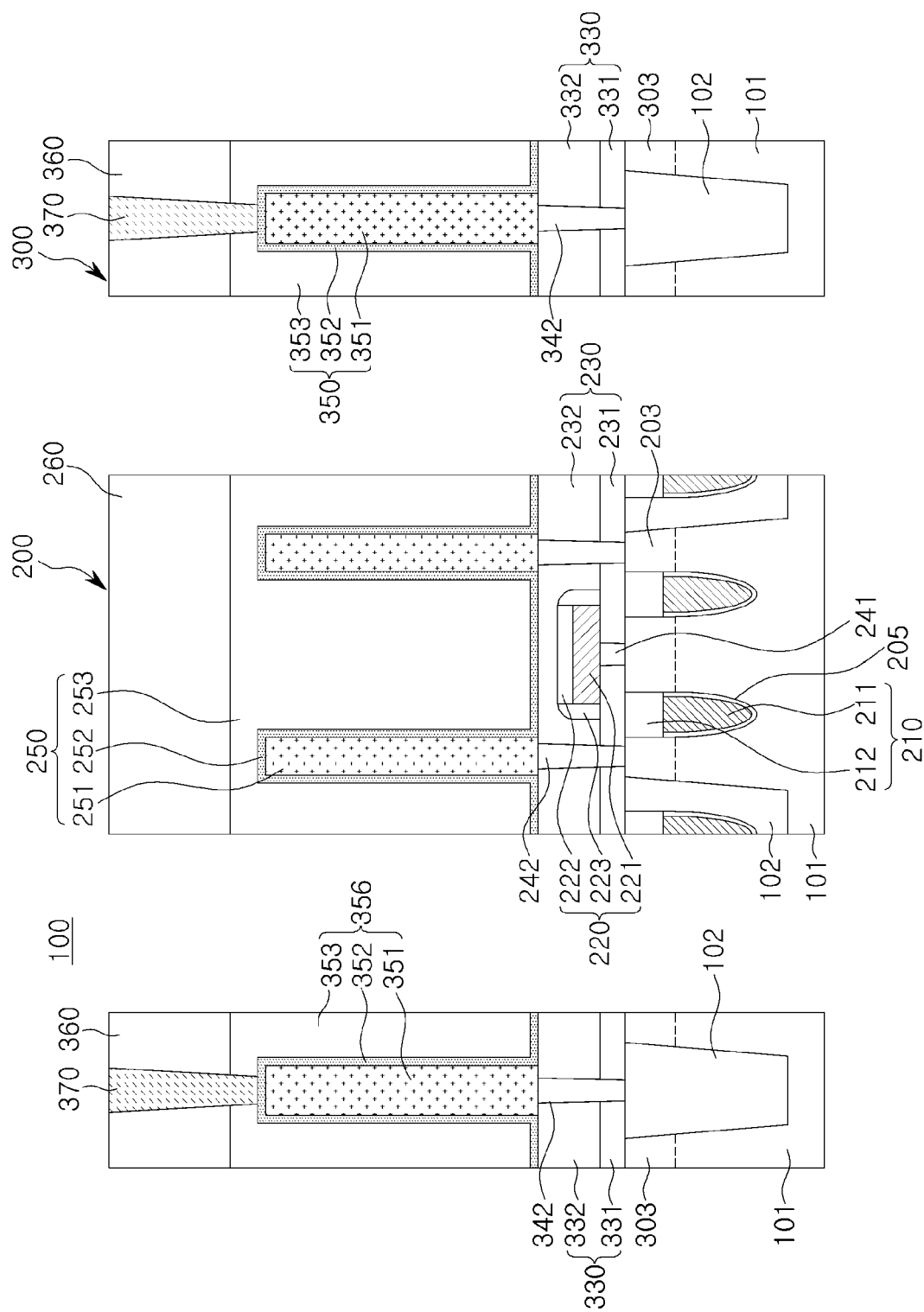

Referring to FIG. 21, the first upper insulating layer 260 may be formed on an upper surface of the first upper electrode layer 253, and the second upper insulating layer 360 may be formed on an upper surface of the second upper electrode layer 353. The first upper insulating layer 260 and the second upper insulating layer 360 may be integrally formed. In addition, the second upper insulating layer 360 and the second upper electrode layer 353 may be etched, and spaces, in which the second upper insulating layer 360 and the second upper electrode layer 353 are etched, may be filled with a conductive material to form the upper contacts 370.

Figure 22:
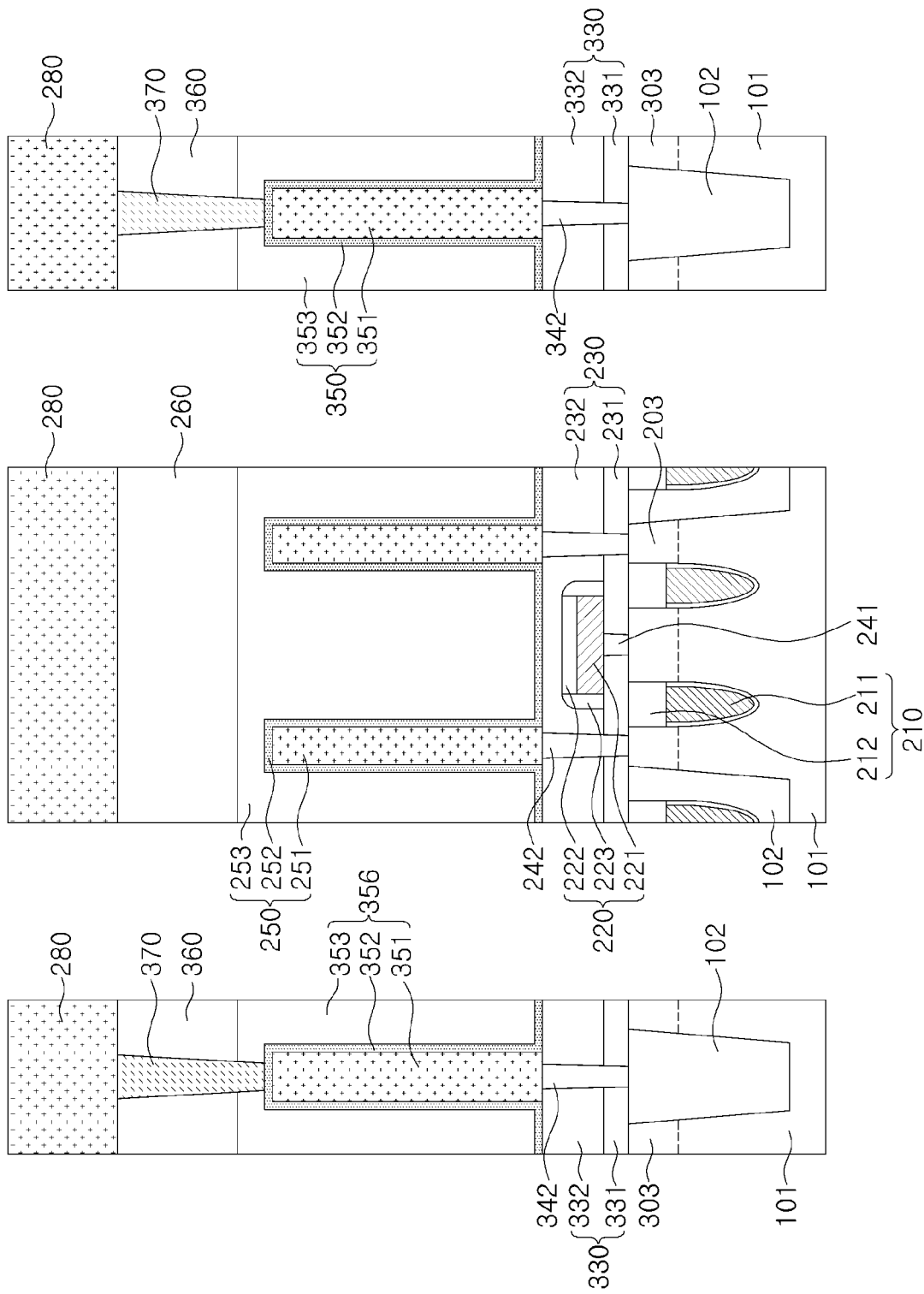

Referring to FIG. 22, the upper conductive layer 280 covering the first upper insulating layer 260 and the second upper insulating layer 360 may be formed. The upper conductive layer 280 may be integrally formed on the first region 200 and the second region 300. Accordingly, the memory device 100 according to the example embodiment illustrated in FIG. 13 may be manufactured.

According to the example embodiment of the disclosure described above with reference to FIGS. 6 to 22, the lengths of the first and second dummy capacitors 350 and 356 in the first direction X may be shorter than the lengths of the third and fourth dummy capacitors 355 and 357 in the second direction Y. However, the disclosure is not limited thereto, and the first to fourth dummy capacitors 350, 355, 356, and 357 may have various lengths and shapes.

Figure 23:
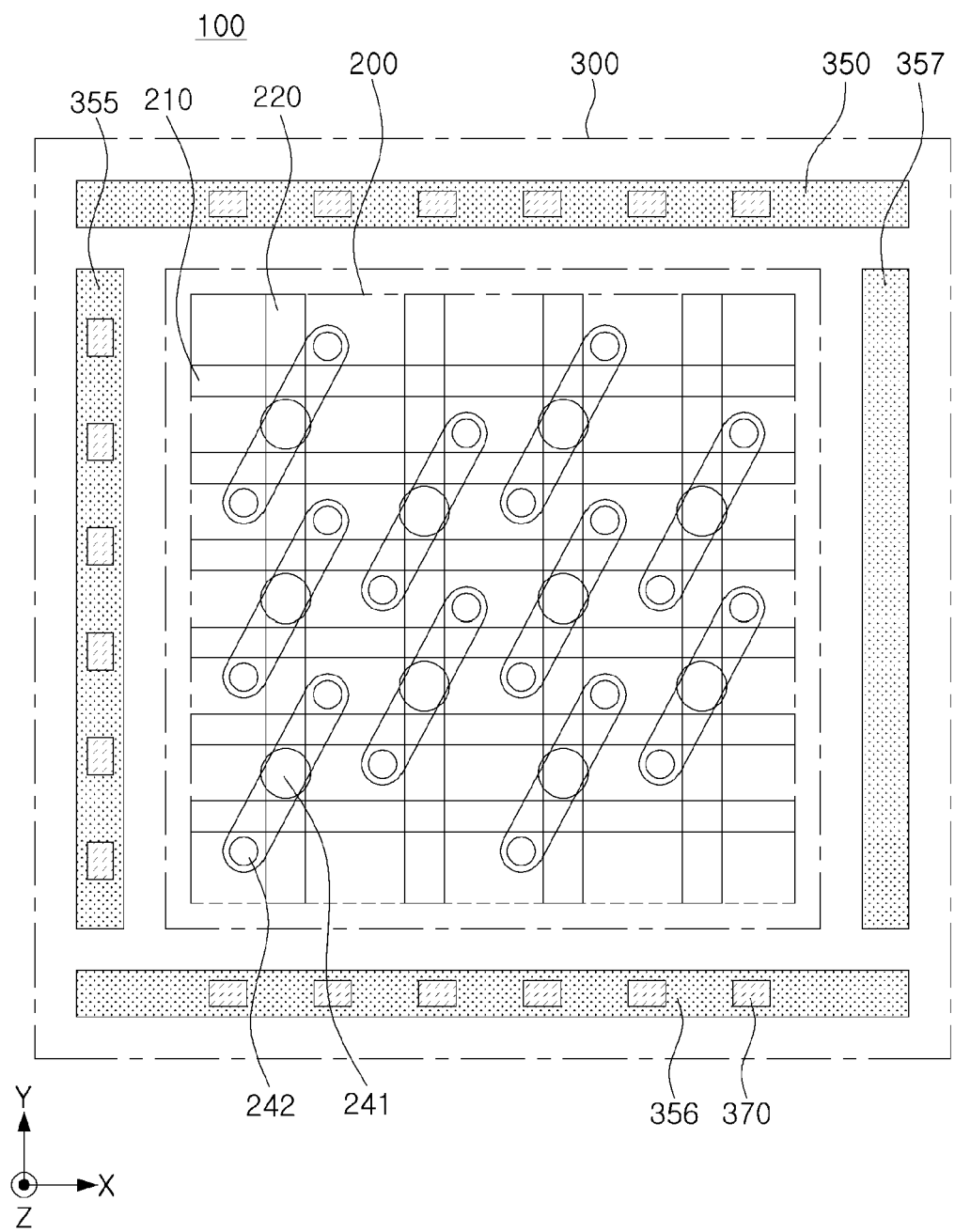
FIGS. 23 to 26 are plan views of memory devices according to various example embodiments of the present disclosure.
Figure 24:
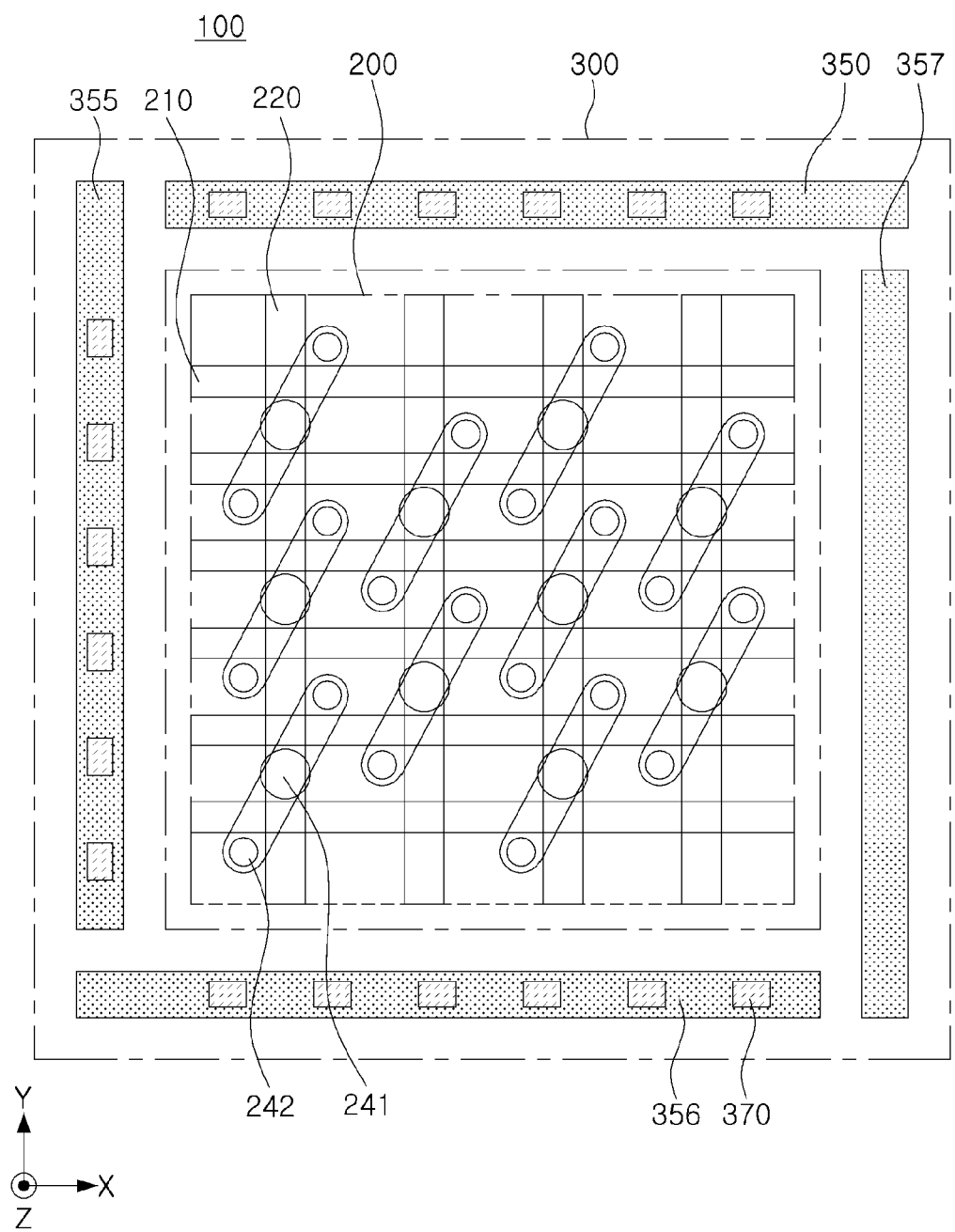
Figure 25:
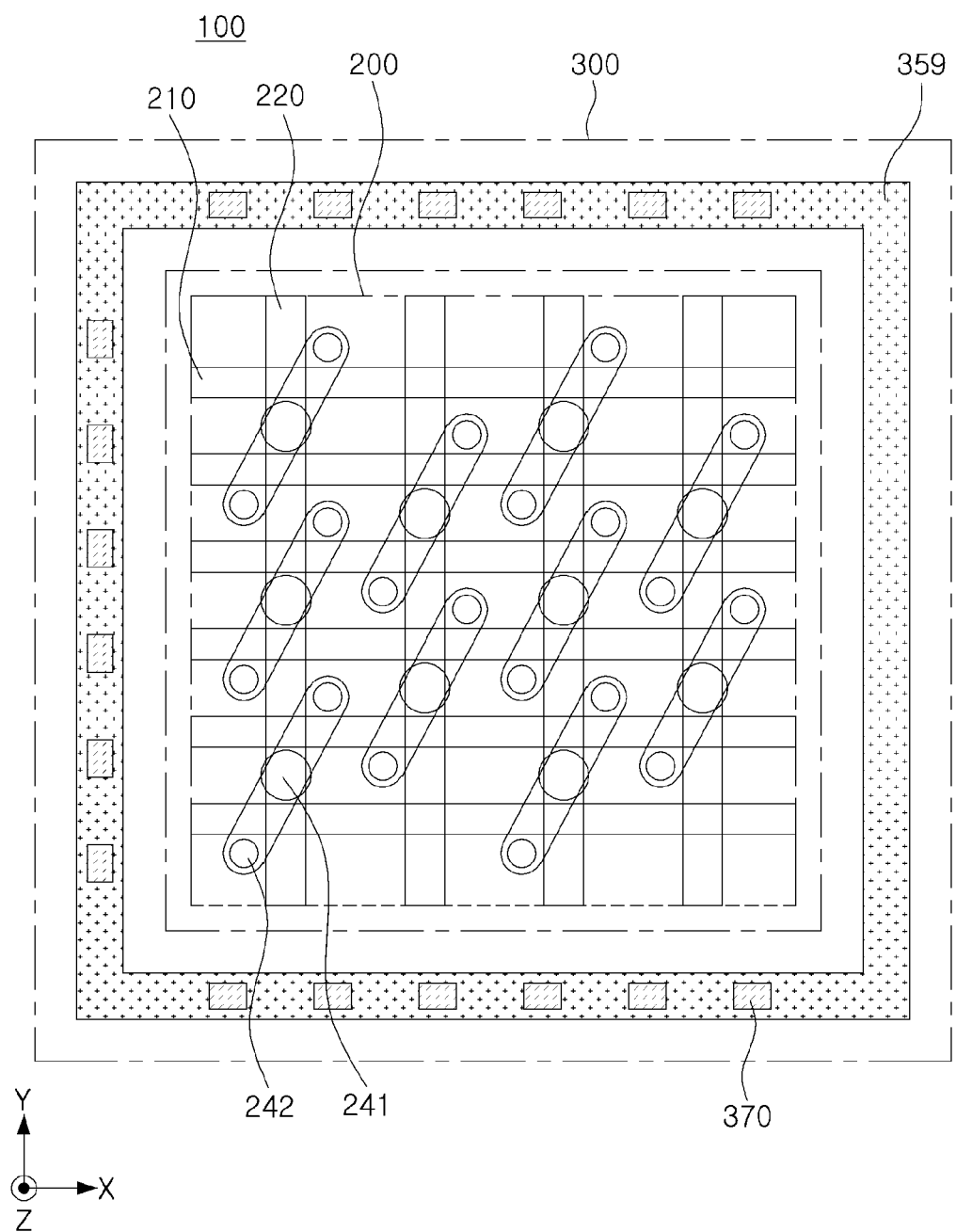

FIGS. 23 to 25 illustrate the memory device 100 including the first to fourth dummy capacitors 350, 355, 356, and 357 having various lengths and shapes.

Referring to FIG. 23, the lengths of the first and second dummy capacitors 350 and 356 in the first direction X may be longer than lengths of the third and fourth dummy capacitors 355 and 357 in the second direction Y. Referring to FIG. 24, the lengths of the first and second dummy capacitors 350 and 356 in the first direction X may be equal to the lengths of the third and fourth dummy capacitors 355 and 357 in the second direction Y. Alternatively or additionally, referring to FIG. 25, the dummy capacitors extending in the first direction X and the dummy capacitors extending in the second direction Y may contact each other to form an integral dummy capacitor 359.

For example, as shown in FIGS. 6 to 25, the lengths of the first and second dummy capacitors 350 and 356 in the first direction X and the lengths of the third and fourth dummy capacitors 355 and 357 in the second direction Y may be determined based on a storage capacity provided by the memory cell array and/or a size of the memory cell array.

According to the example embodiment of the disclosure described above with reference to FIGS. 6 to 25, the memory device 100 may include the first region 200 in which one memory cell array is disposed and the second region 300 in which one or more dummy capacitors surrounding the side surface of the first region 200. However, the disclosure is not limited thereto. In the first region 200, the memory cell array and/or a peripheral circuit may be further disposed.

Figure 26:
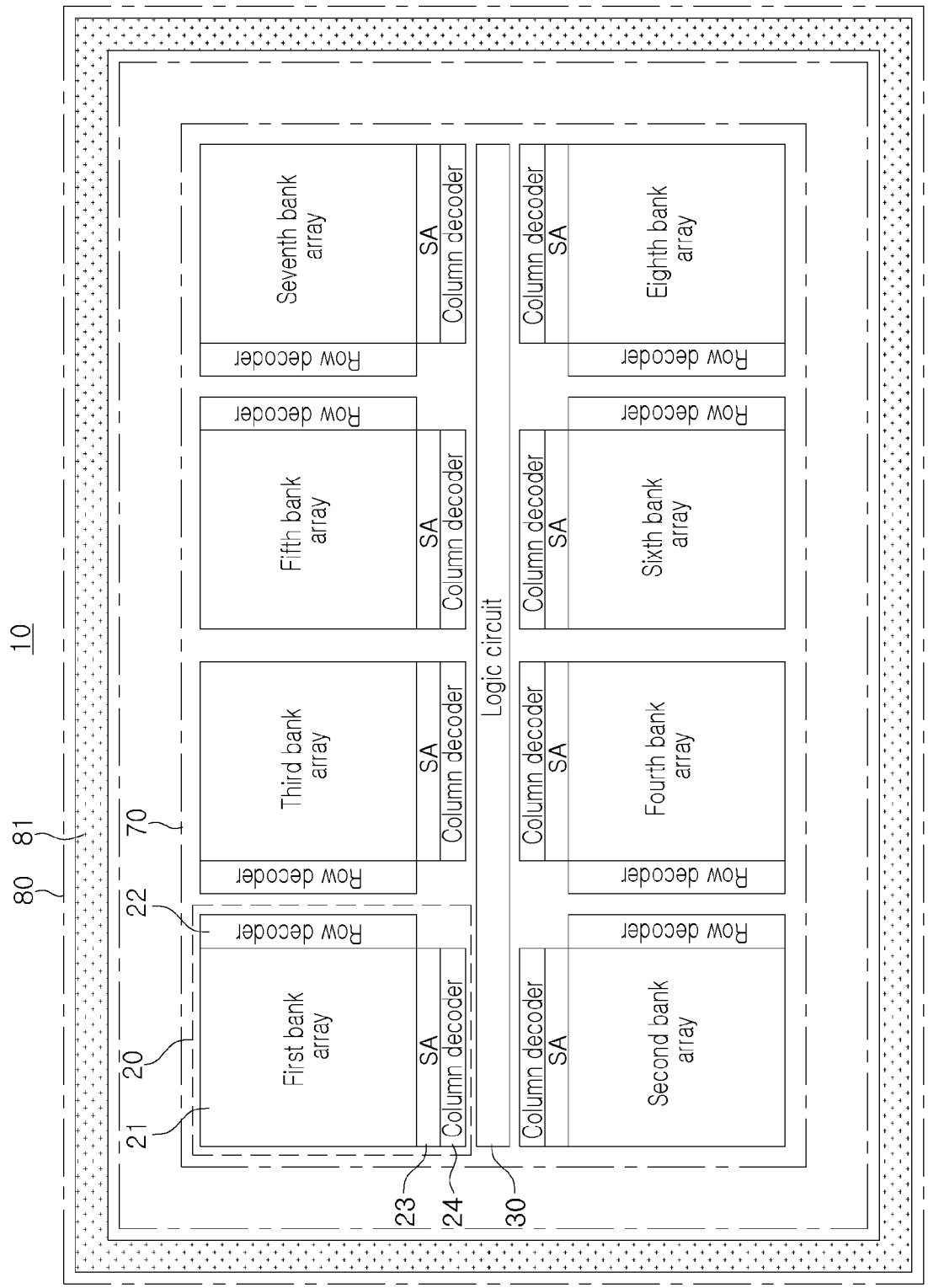

FIG. 26 illustrates the memory device 10 according to an example embodiment of the disclosure.

The memory device 10 may include a first region 70 and a second region 80. The first region 70 may include memory banks 20 each including a memory cell array and a peripheral circuit. The second region 80 may surround the first region 70. One or more dummy capacitors 81 surrounding the first region 70 may be disposed in the second region 80. The dummy capacitor 81 may shield side surfaces of cell capacitors included in the plurality of memory cell arrays disposed in the first region 70.

Upper contacts (not shown) in contact with the upper surfaces of the dummy capacitor 81 may be disposed, and an upper conductive layer in contact with upper surfaces of the upper contacts and covering the upper surface of the first region 70 may be further disposed. The upper contacts and the upper conductive layer may shield side surfaces and upper surfaces of the cell capacitors. According to an example embodiment of the disclosure, the cell capacitors may be protected from external neutrons and particles generated by nuclear fission, and an occurrence of defects in the cell capacitors due to radiation may be suppressed.

The memory device according to an example embodiment of the disclosure may shield the cell capacitors from external radiation by including the dummy capacitor surrounding side surfaces of the cell capacitors included in the memory cell array.

In the method of manufacturing a memory device according to an example embodiment of the disclosure, the dummy capacitor shielding the cell capacitors from external radiation may be formed in the process of forming the memory cell array.

While example embodiments have been illustrated and described above, it will be apparent to those skilled in the art that modifications and variations could be made without departing from the scope of the disclosure as defined by the appended claims.

What is claimed is:
1. A memory device, comprising:
a memory cell array comprising gate structures formed on a substrate, first active regions adjacent to the gate structures, gate insulating layers disposed between the gate structures and the first active regions, and cell capacitors connected to the first active regions and extending in a vertical direction with respect to a surface of the substrate;
a first dummy capacitor and a second dummy capacitor extending in a first direction and in the vertical direction, and disposed to be adjacent to the memory cell array in a second direction intersecting the first direc- tion, the first direction and the second direction being parallel to the surface of the substrate;

a third dummy capacitor extending in the second direction and the vertical direction and disposed to be adjacent to the memory cell array in the first direction;

a fourth dummy capacitor extending in the second direction and the vertical direction and disposed to be adjacent to the memory cell array in the first direction;

one or more upper contacts overlapping, in the vertical direction, the first dummy capacitor, the second dummy capacitor, and the third dummy capacitor; and an upper conductive layer in contact with the one or more upper contacts and is disposed to cover upper surfaces of the cell capacitors, wherein the memory cell array is disposed between the first dummy capacitor and the second dummy capacitor, wherein the memory cell array is disposed between the third dummy capacitor and the fourth dummy capacitor.

2. The memory device of claim 1, wherein the gate structures are embedded in the substrate.

3. The memory device of claim 1, wherein the cell capacitors comprise a first lower electrode layer extending in the vertical direction, a first dielectric layer surrounding the first lower electrode layer, and a first upper electrode layer covering the first dielectric layer, and wherein each of the first dummy capacitor, the second dummy capacitor, the third dummy capacitor and the fourth dummy capacitor comprises a second lower electrode layer extending in the vertical direction, a second dielectric layer surrounding the second lower electrode layer, and a second upper electrode layer covering the second dielectric layer.

4. The memory device of claim 3, wherein the one or more upper contacts pass through the second upper electrode layer.

5. The memory device of claim 4, wherein the one or more upper contacts further pass through the second dielectric layer.

6. The memory device of claim 3, wherein the one or more upper contacts and the second lower electrode layer are formed of a same material.

7. The memory device of claim 3, wherein the substrate further comprises a dummy capacitor region surrounding the memory cell array, a device separation layer being formed in the dummy capacitor region, and wherein the memory device further comprises a second contact connecting the device separation layer formed in the dummy capacitor region to the second lower electrode layer.

8. The memory device of claim 3, wherein the first lower electrode layer and the second lower electrode layer are formed of a same material.

9. The memory device of claim 3, wherein a first distance between a first lower surface of the first lower electrode layer and the surface of the substrate in the vertical direction matches a second distance between a second lower surface of the second lower electrode layer and the surface of the substrate in the vertical direction.

10. The memory device of claim 3, wherein the first lower electrode layer and the second lower electrode layer have a same length in the vertical direction.

11. The memory device of claim 1, wherein a first length of the first dummy capacitor in the first direction and a second length of the second dummy capacitor in the first direction are longer than a third length of the third dummy capacitor in the second direction and a fourth length of the fourth dummy capacitor in the second direction.

12. A memory device, comprising:

a substrate comprising a first region having word lines and bit lines and a second region, the second region surrounding the first region;

a plurality of cell capacitors extending from the first region in a vertical direction with respect to a surface of the substrate, and each cell capacitor of the plurality of cell capacitors being connected to one of the word lines and one of the bit lines;

a plurality of first dummy capacitors extending from the second region in the vertical direction and in a first direction in which the word lines extend, the plurality of first dummy capacitors being adjacent to the first region in a second direction parallel to the surface of the substrate;

a plurality of second dummy capacitors extending from the second region in the vertical direction and in the second direction in which the bit lines extend, the plurality of first dummy capacitors being adjacent to the first region in the first direction;

a plurality of upper contacts in contact with an upper surface of at least one dummy capacitor of the plurality of first dummy capacitors or the plurality of second dummy capacitors; and an upper conductive layer contacting upper surfaces of the plurality of upper contacts and covering the first region in the vertical direction.

* * * * *